United States Patent
Chikuma et al.

(10) Patent No.: US 7,315,766 B2
(45) Date of Patent: Jan. 1, 2008

(54) COMPONENT MOUNTING APPARATUS AND COMPONENT MOUNTING METHOD

(75) Inventors: Toru Chikuma, Izumi (JP); Hiroto Miyazaki, Chikushino (JP); Junichi Kawashima, Ibaraki (JP); Youichi Tanaka, Ogoori (JP); Noriaki Yoshida, Ikeda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 91 days.

(21) Appl. No.: 10/544,140

(22) PCT Filed: Feb. 20, 2004

(86) PCT No.: PCT/JP2004/002019

§ 371 (c)(1),
(2), (4) Date: Aug. 2, 2005

(87) PCT Pub. No.: WO2004/075618

PCT Pub. Date: Sep. 2, 2004

(65) Prior Publication Data

US 2006/0179645 A1 Aug. 17, 2006

(30) Foreign Application Priority Data

Feb. 24, 2003 (JP) .............................. 2003-045452

(51) Int. Cl.
*G06F 19/00* (2006.01)

(52) U.S. Cl. ..................... 700/121; 29/739; 29/740

(58) Field of Classification Search ................ 700/121; 739/739–740; 29/739–740

See application file for complete search history.

(56) References Cited

U.S. PATENT DOCUMENTS

| 5,498,942 | A | * | 3/1996 | Ijuin ........................ 318/567 |
| 5,692,292 | A | * | 12/1997 | Asai et al. .................... 29/740 |
| 5,924,192 | A | * | 7/1999 | Wuyts ......................... 29/833 |
| 6,161,277 | A | * | 12/2000 | Asai et al. .................... 29/740 |
| 6,199,738 | B1 | * | 3/2001 | Kondo et al. ............... 226/110 |
| 6,966,738 | B1 | * | 11/2005 | Weber et al. ............... 414/411 |

FOREIGN PATENT DOCUMENTS

| EP | 0 838 992 | 4/1998 |
| JP | 2940193 | 6/1999 |

* cited by examiner

*Primary Examiner*—Alexander Kosowski
(74) *Attorney, Agent, or Firm*—Wenderoth, Lind & Ponack, L.L.P.

(57) ABSTRACT

In component mounting for executing a component feed operation and component holding and pickup operation, a recipe for the component holding and pickup operation that is an operational program for executing the component holding and pickup operation is received in a head unit, and the component holding and pickup operation is executed on the basis of the recipe. In addition, a timing signal based on this execution is transmitted from the head unit to a component feed unit, a recipe for the component feed operation for executing the component feed operation is received in the component feed unit, and the component feed operation is completed on the basis of this recipe and the timing signal transmitted from the head unit.

25 Claims, 17 Drawing Sheets

US 7,315,766 B2

COMPONENT MOUNTING APPARATUS AND COMPONENT MOUNTING METHOD

TECHNICAL FIELD

The present invention relates to a component mounting apparatus and method for holding and picking up a plurality of components fed from a component feed unit by a head unit, and mounting each of these held components onto a board and relates, in particular, to a component mounting apparatus and component mounting method for executing such component mounting by controlling an operation of feeding the components performed by the component feed unit and a holding and picking up operation performed by the head unit while correlating these operations with each other.

BACKGROUND ART

Conventionally, as a component mounting apparatus and component mounting method of this kind, various ones have been known. As one example of various component mounting apparatuses of this kind, FIG. 18 shows a schematic explanatory view showing a schematic construction of a conventional component mounting apparatus 500 (refer to, for example, Japanese examined Patent Publication No. 2940193).

As shown in FIG. 18, reference numeral 501 denotes a rotary head as one example of a head unit, and a plurality of transfer heads 502 are provided along a circumferential direction of this rotary head 501. Further, each of the transfer heads 502 is provided with a nozzle 503 that is able to releasably suck by vacuum and hold a component P such as an electronic component. The rotary head 501 is also provided with a motor M1 as a driving motor and is able to rotate by being driven by the motor M1. Each nozzle 503 is elevatable in accordance with drive by the motor M1 of the rotary head 501.

Moreover, as shown in FIG. 18, the component mounting apparatus 500 is provided with an X-Y table 504 that releasably holds a board 514 on its machine table (not shown) and moves the board 514 in this held state in an illustrated X-axis direction or Y-axis direction, thereby allowing the board to be aligned in a position with the component P held by each nozzle 503 of the rotary head 501. Moreover, the X-Y table 504 is provided with an X-motor MX capable of performing a conveyance operation in the illustrated X-axis direction by driving of the motor, and a Y-motor MY capable of performing a conveyance operation in the illustrated Y-axis direction by driving of this motor.

Moreover, as shown in FIG. 18, the component mounting apparatus 500 is provided with a component feed unit 505 that feeds a plurality of components P to be mounted onto the board 514 while allowing the components to be picked up by respective nozzles 503. This component feed unit 505 is also provided with a plurality of parts feeders 508 (only one parts feeder 508 is shown in FIG. 18) such as tape feeders that supply (i.e., feed) a plurality of components P received on a carrier tape while allowing the components to be picked up, and a slide base 506 that moves a table 507 on which the parts feeders 508 are placed together with the parts feeders 508 along the illustrated Y-axis direction. Further, the slide base 506 is provided with a ball screw shaft section 509 arranged in the illustrated Y-axis direction, a nut section (not shown) that is meshed with this ball screw shaft section 509 and fixed to a lower surface of the table 507, and a motor M2 that rotatively drives the ball screw shaft section 509 around its axial center. With this arrangement, the table 507 can be moved so as to advance and retreat along the illustrated Y-axis direction by rotatively driving the ball screw shaft section 509 by the motor M2 on the slide base 506, and component P of desired parts feeder 508 can be stopped in a pickup position of the nozzle 503.

Moreover, the component mounting apparatus 500 is provided with a vacuum unit 510, and the vacuum unit 510 communicates with each of the nozzles 503 through a tube 511. Moreover, a solenoid valve 512 is provided partway on the tube 511, and by turning on and off this solenoid valve 512, the component P can be held by vacuum suction and released from a held state at a tip of nozzle 503.

Moreover, the component mounting apparatus 500 is further provided with a control unit 513 that executes centralized control of the motor M1 for motion control of the rotary head 501, control of the vacuum unit 510 and the solenoid valve 512, control of the motors MX and MY for motion control of the X-Y table 504, and control of the motor M2 for motion control of the component feed unit 505 while correlating these motions to one another. Operations of constituent sections of the component mounting apparatus 500 are controlled by the control unit 513, thereby executing a component mounting operation of making the rotary head 501 suck by vacuum, hold and pick up a component P from the parts feeder 508 by use of nozzle 503 while rotating, then relatively transferring this component P onto the board 514, releasing holding of this component by releasing a vacuum suction state, and mounting the component P onto the board 514. As with the control unit 513 of the component mounting apparatus 500, a control system for intensively executing control of operations of a plurality of constituent sections by one control unit is generally called a "centralized control system".

In recent years, motion control in each constituent section of a component mounting apparatus has been advanced and complicated in accordance with diversification of component mounting and improvement in accuracy of component mounting, and the control unit 513 is required to be able to execute advanced complicated control also in the component mounting apparatus 500 that adopts the aforementioned centralized control system.

However, in accordance with advancement and complication of control in component mounting, despite the fact that it is most efficient to confirm fundamental operations, operational performances and the like of individual constituent sections at an early stage and thereafter confirm control performance of the entire component mounting apparatus in an apparatus developmental process, and the centralized control system is adopted as described above. Therefore, it is difficult to separate control software and the like for each of the individual constituent sections in the control unit 513, and this disadvantageously becomes a factor for hindering shortening of a developmental period. As described above, unless the developmental period can be shortened, it becomes impossible to provide apparatuses that can cope with a variety of needs demanded by users of the component mounting apparatuses in a short period.

Moreover, there is no small number of cases where the constituent sections of the component mounting apparatus 500 are concurrently controlled in parallel with one another. In such a case, control throughput of the control unit 513 increases in accordance with advancement and complication of control as described above, thereby possibly failing in improving processing speed and sometimes causing a reduction in control speed and a variation in the control speed.

This disadvantageously becomes a factor for hindering improvement of controllability during component mounting.

SUMMARY OF THE INVENTION

Accordingly, an object of the present invention is to solve the aforementioned problems and provide a component mounting apparatus and component mounting method provided with a control system that is able to improve controllability of motion control of constituent sections of a head unit, component feed unit and the like during component mounting including holding and picking up a plurality of components fed from a component feed unit by the head unit, and mounting each of these held components onto a board, and to reduce a developmental period of control of this component mounting.

In accomplishing these and other aspects, according to a first aspect of the present invention, there is provided a component mounting apparatus comprising:

a component feed unit for executing a component feed operation for feeding a plurality of components in order to allow the components to be picked up;

a head unit which has a plurality of component holding members for releasably holding the components, for executing a component holding and pickup operation for holding and picking up the components from the component feed unit so as to mount the components onto a board by one or the plurality of component holding members;

a head unit control section for controlling the component holding and pickup operation of the head unit;

a component feed unit control section for controlling the component feed operation of the component feed unit; and a main control section for transmitting recipes of operational programs, for executing operations in the head unit control section and the component feed unit control section, to the head unit control section and the component feed unit control section, wherein the head unit control section is operable to execute the component holding and pickup operation on basis of a transmitted recipe, and the component feed unit control section is operable to execute the component feed operation based on the transmitted recipe.

According to a second aspect of the present invention, there is provided the component mounting apparatus as defined in the first aspect, wherein the head unit control section is provided for the head unit, and the component feed unit control section is provided for the component feed unit.

According to a third aspect of the present invention, there is provided the component mounting apparatus as defined in the first aspect, wherein the head unit control section is operable to execute the component holding and pickup operation on basis of the transmitted recipe, and is operable to transmit a timing signal based on this execution to the component feed unit control section, and the component feed unit control section completes the component feed operation on basis of the transmitted recipe and transmitted timing signal.

According to a fourth aspect of the present invention, there is provided the component mounting apparatus as defined in the third aspect, wherein the component feed unit control section is operable to transmit a timing signal, based on an executed component feed operation, to the head unit control section, and the head unit control section is operable to complete the component holding and pickup operation on basis of this transmitted timing signal and the transmitted recipe.

According to a fifth aspect of the present invention, there is provided the component mounting apparatus as defined in the first aspect, further comprising:

a head moving unit for executing a head moving operation for moving the head unit in a direction roughly parallel to a surface of the board; and a moving unit control section for controlling the head moving operation of the head moving unit, wherein the main control section is operable to transmit a recipe, for executing the head moving operation in the moving unit control section, to the moving unit control section, and the moving unit control section is operable to execute the head moving operation on basis of this transmitted recipe.

According to a sixth aspect of the present invention, there is provided the component mounting apparatus as defined in the fifth aspect, wherein the moving unit control section is provided for the head moving unit.

According to a seventh aspect of the present invention, there is provided the component mounting apparatus as defined in the fifth aspect, wherein the head unit control section is operable to transmit a timing signal, based on execution of the operation, to the moving unit control section, and the moving unit control section is operable to complete the head moving operation on basis of the transmitted recipe and this transmitted timing signal.

According to an eighth aspect of the present invention, there is provided the component mounting apparatus as defined in the seventh aspect, wherein the moving unit control section is operable to transmit a timing signal, based on an executed head moving operation, to the head unit control section, and the head unit control section is operable to complete the component holding and pickup operation on basis of this transmitted timing signal and the transmitted recipe.

According to a ninth aspect of the present invention, there is provided the component mounting apparatus as defined in the fifth aspect, wherein the head unit is operable to execute a component mounting operation for mounting a component or components held by the one or the plurality of component holding members by releasing holding of the component(s) on the board, the main control section is operable to transmit the recipe for executing the component mounting operation to the head unit control section, and is operable to transmit the recipe for executing the head moving operation for the component mounting operation to the moving unit control section, and the head unit control section is operable to execute the component mounting operation on basis of this transmitted recipe, and the moving unit control section is operable to execute the head moving operation for the component mounting operation on basis of this transmitted recipe.

According to a tenth aspect of the present invention, there is provided the component mounting apparatus as defined in the ninth aspect, wherein the head unit control section is operable to execute the component mounting operation on basis of the transmitted recipe, and is operable to transmit a timing signal, based on execution of this operation, to the moving unit control section, and the moving unit control section is operable to complete the head moving operation for the component mounting operation on basis of the transmitted recipe and this transmitted timing signal.

According to an eleventh aspect of the present invention, there is provided the component mounting apparatus as defined in third aspect, wherein the recipe for executing for the component holding and pickup operation comprises:

an operational program for executing a component holding preparational operation for moving down the one or the plurality of component holding members, for holding the component or components in the head unit, to a component holding standby height position along a direction roughly perpendicular to a surface of the board; and an operational program for executing a component holding main operation for further moving down the one or the plurality of component holding members from the component holding standby height position and holding the component or components, thereby allowing these components to be picked up in the component feed unit by the one or the plurality of component holding members, and the head unit control section is operable to make the component feed unit control section recognize completion of the component holding preparational operation on basis of the recipe by transmitting the timing signal.

According to a twelfth aspect of the present invention, there is provided the component mounting apparatus as defined in the eleventh aspect, wherein the component feed unit comprises a plurality of component pickup positions in which components are arranged for allowing them to be picked up by the component holding members, and the recipe for executing the component feed operation comprises:

an operational program for executing a component feed preparational operation for transporting the components in the component feed unit so that the components are positioned in the component pickup positions; and an operational program for executing a component feed main operation for putting these transported components into a state in which the components can be picked up by the component holding member, and the component feed unit control section is operable to execute the component feed preparational operation on basis of the recipe, to complete the component feed main operation on basis of the recipe and the timing signal transmitted from the head unit control section, and to make the head unit control section recognize completion of the component feed main operation by transmitting the timing signal to the head unit control section.

According to a thirteenth aspect of the present invention, there is provided the component mounting apparatus as defined in the third aspect or seventh aspect, wherein the head unit control section is operable to transmit a plurality of timing signals formed on basis of elevation positions of each of the component holding members along a direction roughly perpendicular to the surface of the board.

According to a fourteenth aspect of the present invention, there is provided the component mounting apparatus as defined in the fifth aspect, wherein the main control section comprises:

a recipe forming section for forming each of the recipes; and a recipe transmission section for transmitting each of these formed recipes.

According to a fifteenth aspect of the present invention, there is provided the component mounting apparatus as defined in the fourteenth aspect, wherein the head unit control section, the component feed unit control section or the moving unit control section is operable to transmit error information generated when operations are executed on the basis of respective recipes transmitted to the main control section, in the main control section, the recipe forming section is operable to correct a recipe, relevant to the error information, from out of already transmitted recipes on basis of this transmitted error information, and the recipe transmission section is operable to transmit this corrected recipe in order to allow an already transmitted recipe to be replaced by the corrected recipe.

According to a sixteenth aspect of the present invention, there is provided the component mounting apparatus as defined in the third aspect, wherein the component feed unit comprises a plurality of component pickup positions that are arranged in a line with a constant pitch, and arranges components for allowing the components to be picked up by the component holding members, the component holding members are arranged with a constant pitch, of an integral multiple of a constant pitch in the head unit, along a direction in which the component pickup positions are arranged, and the recipe for the component feed operation transmitted from the main control section to the component feed unit control section comprises at least positional information of one or the plurality of component pickup positions where the component feed operation is to be executed.

According to a seventeenth aspect of the present invention, there is provided the component mounting apparatus as defined in the sixteenth aspect, wherein the recipe for the component holding and pickup operation transmitted from the main control section to the head unit control section comprises at least information capable of recognizing the one or the plurality of component holding members in which the component holding and pickup operation is executed, and positional information of the one or the plurality of component pickup positions where the component feed operation is executed.

According to an eighteenth aspect of the present invention, there is provided the component mounting apparatus as defined in the fifth aspect, wherein the recipe for the head moving operation transmitted from the main control section to the moving unit control section comprises at least positional information of a movement position of the one or the plurality of component holding members in a direction roughly along the surface of the board where the component holding and pickup operation is to be executed or the component mounting operation is to be executed.

According to a nineteenth aspect of the present invention, there is provided the component mounting apparatus as defined in the eighteenth aspect, wherein the recipe for the component mounting operation transmitted from the main control section to the head unit control section comprises at least information capable of recognizing the one or the plurality of component holding members by which the component holding and pickup operation is executed or the component mounting operation is executed.

According to a twentieth aspect of the present invention, there is provided a component mounting apparatus comprising:

a component feed unit for executing a component feed operation for feeding a plurality of components in order to allow the components to be picked up;

a head unit which has a plurality of component holding members for releasably holding the components, for executing a component holding and pickup operation for holding and picking up the components from the component feed unit so as to mount the components onto a board by one or the plurality of component holding members;

a head unit control section for controlling the component holding and pickup operation of the head unit; and a main control section for transmitting recipes of operational programs, for executing the component holding and pickup operation, to the head unit control section and for controlling the component feed operation in the component feed unit, wherein the main control section is operable to complete the component feed operation, and is operable to transmit a recipe to the head unit control section, and the head unit control section is operable to complete the component holding and pickup operation on basis of this transmitted recipe.

According to a twenty-first aspect of the present invention, there is provided the component mounting apparatus as defined in the twentieth aspect, wherein the head unit control section is provided for the head unit.

According to a twenty-second aspect of the present invention, there is provided a component mounting method for executing a component feed operation for feeding a plurality of components in a component feed unit in order to allow the components to be picked up, and executing a component holding and pickup operation for picking up the components from the component feed unit so as to mount the components onto a board in a head unit that has a plurality of component holding members that releasably hold the components by one or the plurality of component holding members, the method comprising:

receiving a recipe for the component holding and pickup operation, of an operational program for executing the component holding and pickup operation, in the head unit, executing the component holding and pickup operation on basis of this received recipe and transmitting a timing signal based on execution of this operation to the component feed unit; and receiving a recipe for the component feed operation, of an operational program for executing the component feed operation, in the component feed unit, and completing the component feed operation on basis of this received recipe and the timing signal transmitted from the head unit.

According to a twenty-third aspect of the present invention, there is provided the component mounting method as defined in the twenty-second aspect, wherein each of the recipe for the component holding and pickup operation and the recipe for the component feed operation is formed on a component mounting apparatus main body side provided with the head unit and the component feed unit, and each of these formed recipes is transmitted from the component mounting apparatus main body side to the head unit and the component feed unit.

According to a twenty-fourth aspect of the preset invention, there is provided the component mounting method as defined in the twenty-second aspect, wherein the timing signal, on basis of execution of the component feed operation based on the recipe, is transmitted to the head unit during execution in the component feed unit, and the component holding and pickup operation is executed in the head unit also on basis of the timing signal transmitted from the component feed unit.

According to a twenty-fifth aspect of the present invention, there is provided the component mounting method as defined in the twenty-second aspect, further comprising:

executing a head moving operation, for moving the head unit to a place above the board, in a head moving unit that moves the head unit in a direction roughly parallel to a surface of the board; and executing a component mounting operation for mounting the component or components held by the one or the plurality of component holding members onto the board, whereby a recipe for the component mounting operation for executing the component mounting operation is received in the head unit, the component mounting operation is executed on basis of this received recipe, and a timing signal based on execution of this operation is transmitted to the head moving unit from the head unit; and a recipe for the head moving operation for executing the head moving operation is received in the head moving unit, and the head moving operation is completed on basis of this received recipe and the timing signal transmitted from the head unit.

According to a twenty-sixth aspect of the present invention, there is provided the component mounting method as defined in the twenty-fifth aspect, wherein each of the recipe for the component mounting operation and the recipe for the head moving operation is formed on the component mounting apparatus main body side, and each of these formed recipes is transmitted from the component mounting apparatus main body side to the head unit and the head moving unit.

According to a twenty-seventh aspect of the present invention, there is provided the component mounting method as defined in the twenty-fifth aspect, wherein the timing signal on basis of execution of the head moving operation based on the recipe is transmitted to the head unit during execution in the head moving unit, and the component mounting operation is executed in the head unit also on basis of the timing signal transmitted from the head moving unit.

According to the first through the third aspects of the present invention, instead of adopting the "centralized control system" that intensively executes operational control of a plurality of constituent sections by one control unit as in the control system of the conventional component mounting apparatus, each of the constituent sections is individually provided with a control section, and each operational control is enabled by transmitting and receiving a timing signal between the control sections while being correlated with one another. With this arrangement, fundamental operations, operational controllability and the like of the constituent sections can be confirmed at an early stage in a developmental process, and confirmation of control performance of the component mounting apparatus in its entirety can be efficiently achieved.

In concrete, there are provided control sections including a head unit control section that is provided for the head unit and is able to control a component holding and pickup operation performed by the head unit, a component feed unit control section that is provided for the component feed unit and is able to control a component feed operation performed by the component feed unit, and a main control section that is able to transmit recipes of operational programs capable of executing these operations to the head unit control section and the component feed unit control section. By executing the operations in the head unit control section and the component feed unit control section on basis of recipes transmitted from the main control section and transmission of timing signals, based on execution of these operations, from the head unit control section to the component feed unit control section, the operations can be executed while being correlated with one another.

Therefore, functions, control software and the like provided for the main control section can be reduced, and functions and control software borne by the conventional control unit can be distributionally provided for the head unit control section and the component feed unit control section in place thereof. Therefore, if the recipes and the timing signals, which can be pseudo-formable even without actual constituent sections, are prepared (that is recipes and timing signals are prepared hypothetically) in an apparatus developmental stage, functions and control performances can be confirmed at an early stage in distribution units of the head unit control section, the component feed unit control section and the like, and a developmental period can be markedly shortened in comparison with the conventional centralized control system.

Moreover, by shortening the developmental period of the component mounting apparatus as described above, it becomes possible to provide an apparatus that answers various needs of users of the component mounting apparatus in a short time, thereby taking advantage of this shortened period. Moreover, it is possible to obtain a period for sufficiently providing controllability, and therefore provide a component mounting apparatus whose control accuracy is improved.

Moreover, by making the distribution units of the head unit control section, the component feed unit control section and the like distributionally bear advanced complicated control required for current component mounting apparatus without concentrating control processing on one portion, a processing speed can be improved, and controllability can be made satisfactory.

Furthermore, mutual correlation between the component holding and pickup operation performed by the head unit and the component feed operation performed by the component feed unit can be achieved by directly executing transmission and reception of a timing signal between the head unit control section and the component feed unit control section without intervention of the main control section. Accordingly, there can be provided a component mounting apparatus that can improve a control response by direct communications.

Moreover, informational communications between the head unit control section and the component feed unit control section can be suppressed principally to mere transmission and reception of the timing signal, and this therefore allows an amount of communications between these units to be minimized, thereby making it possible to suppress occurrence of control delay.

Moreover, operations are executed between the head unit control section and the component feed unit control section on basis of a received recipe. By this operation, wiring between the main control section and the head unit control section and between the main control section and the component feed unit control section can be reduced, and this allows an apparatus manufacturing cost of the component mounting apparatus to be reduced also in terms of hardware.

Moreover, even if the head unit control section and the component feed unit control section are provided in places other than places of the head unit and the component feed unit, the aforementioned effects can be obtained.

Furthermore, in a case where operations of a distant mutual correlation are executed in the head unit and the component feed unit, the aforementioned effects can be obtained by executing control individually based on recipes without transferring a timing signal between the head unit control section and the component feed unit control section.

According to the fourth aspect of the present invention, the component feed unit control section is able to transmit the timing signal based on the executed component feed operation to the head unit control section. With this arrangement, the component holding and pickup operation can be executed in the head unit control section on the basis of the timing signal, and the head unit control section and the component feed unit control section can be correlated with each other with regard to such interactive control, thereby allowing controllability to be further improved.

According to the fifth through the tenth aspects of the present invention, the moving unit control section that controls the movement operation of the head unit is further provided. With this arrangement, the head unit control section and the moving unit control section can be correlated with regard to control similarly to the aforementioned relationship between the head unit control section and the component feed unit control section, and effects similar to the effects of the aforementioned aspects can be obtained.

Moreover, even if the moving unit control section is provided in a place other than the place of the head moving unit, the aforementioned effects can be obtained.

Furthermore, in a case where operations of a distant mutual correlation are executed in the head unit and the head moving unit, the aforementioned effects can be obtained by executing control individually based on recipes without transferring a timing signal between the head unit control section and the moving unit control section.

According to the eleventh aspect of the present invention, the component holding and pickup operation includes a component holding preparational operation and a component holding main operation. By making the component feed unit control section recognize completion of the component holding preparational operation on basis of the recipe by transmission of the timing signal, the head unit control section can recognize a timing of putting the component to be held and picked up in the component feed unit control section into a state in which it can be picked up, and respective operations can be correlated with each other. By virtue of this thus enabled correlation, effects of the aforementioned aspects can be concretely obtained.

According to the twelfth aspect of the present invention, the component feed operation includes the component feed preparational operation and the component feed main operation. The component feed unit control section is able to execute the component feed preparational operation on the basis of the recipe, complete the component feed main operation on the basis of the recipe and the timing signal transmitted from the head unit control section and make the head unit control section recognize completion of the component feed main operation by transmission of the timing signal to the head unit control section, and mutual operational control can be more closely correlated. By virtue of this thus enabled correlation, effects of the aforementioned aspects can be concretely obtained.

According to the thirteenth aspect of the present invention, the head unit control section is able to transmit a plurality of timing signals on the basis of an elevation position of each component holding member. With this arrangement, the component holding and pickup operation, executed by elevation of the component holding member, and the component feed operation can be closely correlated with each other, and effects of the aforementioned aspects can be obtained.

According to the fourteenth aspect of the present invention, the main control section is provided with a recipe forming section and a recipe transmission section. With this arrangement, it becomes possible to input NC data and the like of mounting data for component mounting to the main control section, form each recipe on the basis of the NC data and the like by the recipe forming section in the main control section, and transmit each formed recipe from the recipe transmission section to the control sections, so that the aforementioned effects can concretely be achieved.

According to the fifteenth aspect of the present invention, when an operational error occurs in any one of the head unit control section, the component feed unit control section and the moving unit control section, error information is transmitted to the main control section, and the recipe forming section can correct recipes on the basis of this transmitted error information in the main control section. Therefore, it becomes possible to cope with various operational errors that possibly occur during component mounting while correlating them with each other, with effects of the aforementioned aspects allowed to be obtained.

According to the sixteenth aspect through the nineteenth aspect of the present invention, the recipes to be executed in the control sections of the head unit control section, the component feed unit control section and the moving unit control section include at least positional information of the sections. With this arrangement, operations can be reliably executed on the basis of recipes in respective control sections, and effects of the aforementioned aspects can be achieved.

According to the twentieth aspect or the twenty-first aspect of the present invention, even when the main control section capable of executing operational control of the component feed unit and the head unit control section capable of executing control of the operation of the head unit are provided, effects substantially similar to the effects of the first aspect through the third aspect can be obtained.

According to the twenty-second aspect of the present invention, instead of adopting the "centralized control system" that intensively executes operational control of a plurality of constituent sections in one portion as in the control system of the conventional component mounting apparatus, each of the constituent sections is provided with a function capable of individually executing control, and each operational control is enabled by transmitting and receiving a timing signal between the constituent sections while being correlated with one another. With this arrangement, there can be provided a component mounting method capable of confirming fundamental operations, operational controllability and the like of the constituent sections at an early stage in a developmental process and allowing control performance of the component mounting apparatus in its entirety to be efficiently performed. Accordingly, there can be provided a component mounting method capable of obtaining effects similar to the effects of the third aspect and obtaining effects of shortening the apparatus developmental period and improving controllability, such as improvement of a control response.

According to the twenty-third aspect through the twenty-seventh aspect of the present invention, operations of the component holding and pickup operation, the component feed operation, the component mounting operation and the head moving operation can be executed on the basis of recipes received in the constituent sections of the head unit, the component feed unit and the head moving unit. In addition, by transmitting and receiving a timing signal, based on execution of these operations, between the constituent sections and executing operations also on the basis of this received timing signal, control operations of the constituent sections can be closely correlated with one another. Accordingly, there can be provided a component mounting method capable of concretely obtaining effects of the twenty-second aspect during the component mounting.

BRIEF DESCRIPTION OF DRAWINGS

These and other aspects and features of the present invention will become clear from the following description taken in conjunction with preferred embodiments thereof with reference to the accompanying drawings, in which.

DETAILED DESCRIPTION OF THE PREFERRED EMBODIMENTS

Figure 1:
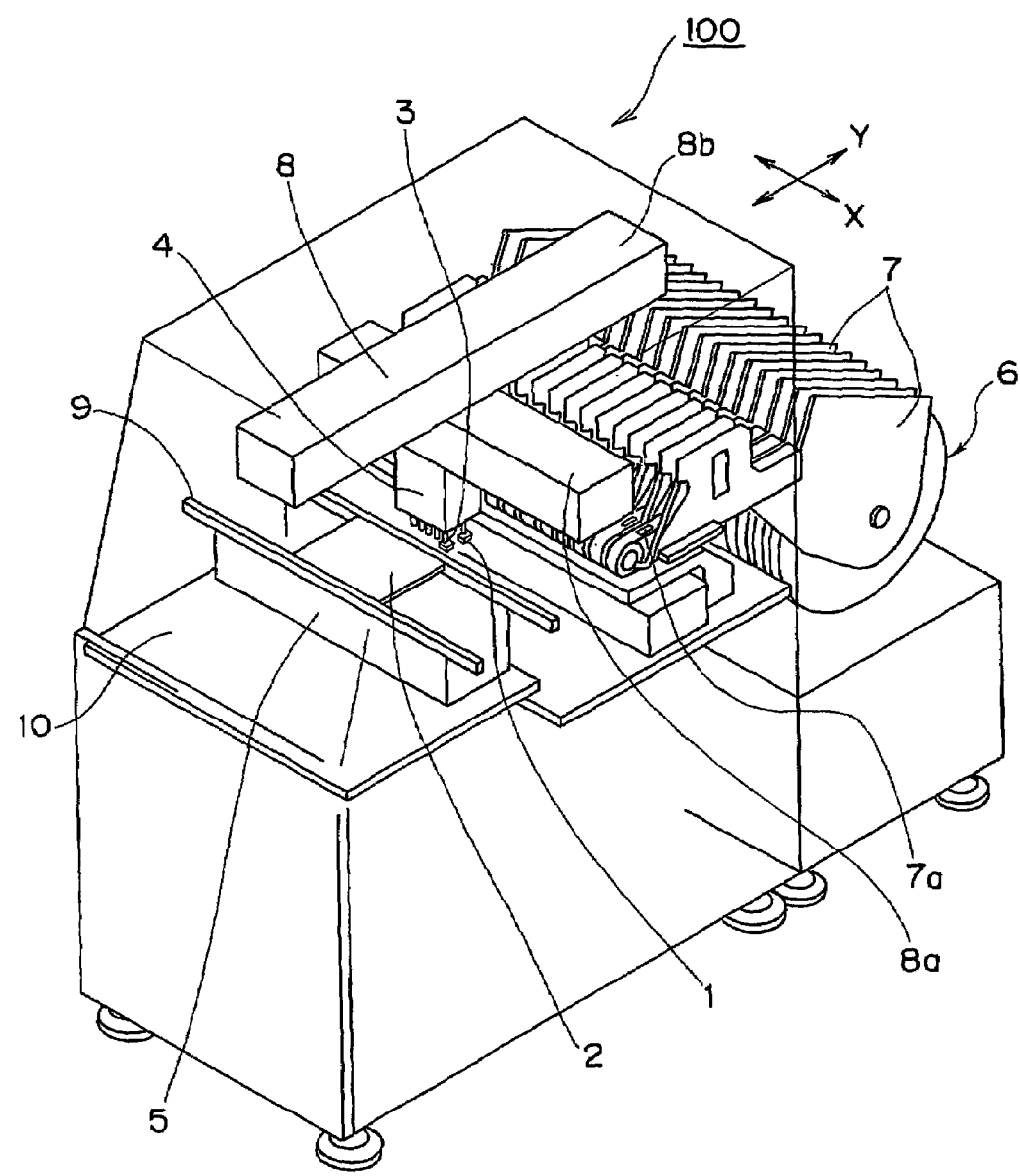
FIG. 1 is a schematic perspective view of a component mounting apparatus according to a first embodiment of the present invention.

Before describing embodiments of the present invention, definitions of "terms" used in the present specification and claims are explained first.

The term "recipe" means an operational program, which is an operational program executed in automatically executing, for example, an operation executed in a component mounting apparatus or by a component mounting method.

The term "timing signal" means a signal outputted (or transmitted) in accordance with contents of the operation in executing the aforementioned recipe, and means a message signal intended for transmitting contents of execution or a state of execution of a self operation to a destination of output. It is to be noted that this timing signal is called an "event" ("event signal") in each of the embodiments of the present invention described below.

The term "component" means components including electronic components, mechanical components, optical components and the like. The electronic components include, for example, chip components (resistors, capacitors, and the like), IC components (bare IC chips, IC-integrated components, and the like) and electronic circuit connecting type components (connector components, and the like). Moreover, such components are principally received on a carrier tape and might be fed by a component feed cassette or the like, or fed in a state in which the components are arranged and received on a component feed tray.

The term "board" means a circuit forming body in or on which an electronic circuit, a photoelectric circuit or the like is formed, and means an object with a circuit formed thereon, such as a circuit board of a resin board, a paper phenol board, a ceramic board, a glass epoxy board, a film board or the like, a circuit board of a single-layer board, a multi-layer board or the like, a component, a casing, a frame or the like.

Before description of the present invention proceeds, it is to be noted that like components are denoted by like reference numerals throughout the accompanying drawings.

The embodiments according to the present invention will be described in detail below with reference to the drawings.

First Embodiment

FIG. 1 shows a schematic explanatory view schematically showing construction of a component mounting apparatus 100 as one example of a component mounting apparatus according to a first embodiment of the present invention.

(Overall Construction of the Component Mounting Apparatus)

As shown in FIG. 1, the component mounting apparatus 100 is provided with a component feed unit 6 as one example of a component feed unit for feeding a plurality of components 1 while allowing the components 1 to be picked up, a stage 5 as one example of a board holding section for releasably holding a board 2 onto which each of the components 1 to be fed is mounted, a head unit 4 that holds and picks up each of the components 1 fed from the component feed unit 6 while allowing each of the components to be picked up and executes mounting of each of these held components onto the board 2 held by the stage 5, and an X-Y robot 8 as one example of a head moving unit for executing a conveyance operation of this head unit 4 in a direction roughly along a surface of the board 2.

Moreover, as shown in FIG. 1, a plurality of, for example ten suction nozzles 3, each as one example of a component holding member that releasably holds component 1 on an upper surface thereof, is provided on a lower surface of the head unit 4. Moreover, the suction nozzles 3 can individually perform suction or release of suction and holding of component 1, and the suction nozzles 3 can be individually moved up and down along a direction roughly perpendicular to the surface of the board 2.

Moreover, as shown in FIG. 1, the X-Y robot 8 is provided with an X-axis robot 8a that supports the head unit 4 and makes the head unit 4 advance and retreat in an illustrated X-axis direction, and a Y-axis robot 8b that supports the X-axis robot 8a and makes the X-axis robot 8a advance and retreat in an illustrated Y-axis direction. With this arrangement, the head unit 4, i.e., the suction nozzles 3 provided for the head unit 4, can be moved in the illustrated X-axis direction or Y-axis direction. It is to be noted that the illustrated X-axis direction and Y-axis direction are directions that are roughly parallel to the surface of the board 2 and perpendicular to each other.

Moreover, the component feed unit 6 is provided with a plurality of component feed cassettes 7, which are provided with so-called taping components such that a plurality of components 1 are received on a carrier tape while being allowed to be picked up, and these received components 1 are put in a state in which they can be picked up by feeding these provided taping components, adjacently each other along the illustrated X-axis direction. Moreover, the component feed cassettes 7 are arranged so that component pickup positions 7a, where the components 1 are positioned in a state in which they can be picked up, are arranged in a line along the X-axis direction.

Moreover, the stage 5 is arranged on a machine table 10 of the component mounting apparatus 100, and a board conveyance unit 9 conveys and supplies a board 2 from the right-hand side in the illustrated X-axis direction to the stage 5 and conveys and ejects the board 2 from the stage 5 to the left-hand side in the illustrated X-axis direction.

Moreover, the component mounting apparatus 100 is provided with a control system for executing control of operations of the head unit 4, the component feed unit 6, the X-Y robot 8, the board conveyance unit 9 and the like, which are constituent sections provided for the component mounting apparatus 100, while correlating these sections with one another. Construction of this control system will be described in detail later.

(Constructions of the Head Unit and Component Feed Unit)

A mutual arrangement relation between each of the suction nozzles 3 of the head unit 4 provided for the component mounting apparatus 100 and each of the component feed cassettes 7 of the component feed unit 6 will be described with reference to a partially transparent schematic explanatory plan view shown in FIG. 2. In the schematic explanatory plan view shown in FIG. 2, six component feed cassettes 7, out of the plurality of component feed cassettes 7 provided for the component feed unit 6, are shown for sake of easy understanding of an explanation. However, the number of the component feed cassettes 7 in the component feed unit 6 is not limited only to the above-mentioned number and is allowed to be freely determined according to an embodiment thereof.

Figure 2:
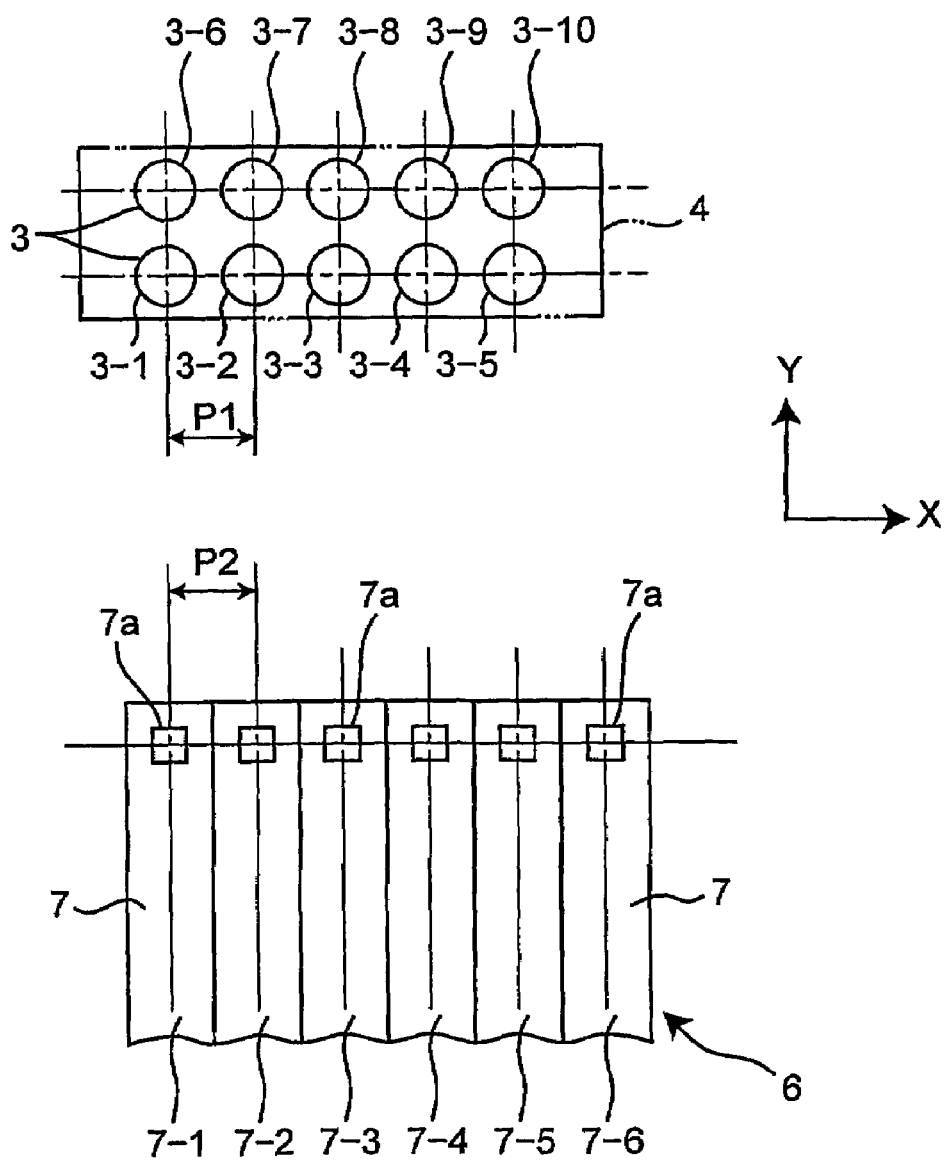
FIG. 2 is a partially transparent schematic plan view showing an arrangement relationship between a head unit and a component feed unit in the component mounting apparatus of the first embodiment.

As shown in FIG. 2, the head unit 4 is provided with ten suction nozzles 3, which are arranged in a matrix of five in the illustrated X-axis direction by two in the illustrated Y-axis direction, i.e., a matrix of five rows by two columns (or two rows by five columns). Moreover, the suction nozzles 3 are arranged with a constant pitch P1 in the illustrated X-axis direction. Concretely, in FIG. 2, suction nozzles 3-1, 3-2, 3-3, 3-4 and 3-5 are arranged in order from the left-hand side to the right-hand side in the figure as a total of five suction nozzles 3 in a lower column in the illustrated Y-axis direction. Moreover, suction nozzles 3-6, 3-7, 3-8, 3-9 and 3-10 are arranged in order from the left-hand side to the right-hand side in FIG. 2 as a total of five suction nozzles 3 in an upper column in the illustrated Y-axis direction. When a specified one of the suction nozzles 3 provided for the head unit 4 is used in a description provided later, this suction nozzle 3 is specified as "suction nozzle 3-N" (note that N is any one of integers of 1 to 10). When a suction nozzle 3 is used without being specified, this suction nozzle 3 is simply referred to as "suction nozzle 3".

On the other hand, in the component feed unit 6, six component feed cassettes 7 are arranged as one example of the plurality of component feed cassettes 7 with a taping component feed direction extended along the illustrated Y-axis direction, and component pickup positions 7*a* provided for the cassettes are arranged with a constant pitch P2 along the illustrated X-axis direction. Concretely, in FIG. 2, component feed cassettes 7-1, 7-2, 7-3, 7-4, 7-5, and 7-6 are arranged in order from the left-hand side to the right-hand side in the figure. When a specified one of the component feed cassettes 7 provided for the component feed unit 6 is used in the description provided later, this component feed cassette 7 is specified as "component feed cassette 7-N" (note that N is any one of integers of 1 to 6). When a component feed cassette 7 is used without being specified, this component feed cassette 7 is simply referred to as "component feed cassette 7".

Moreover, the pitch P1 of the suction nozzles 3 has a dimension of an integral multiple of the pitch P2 of the component feed cassettes 7 (or the component pickup positions 7*a*). In the present first embodiment, for example, the pitch P1 and the pitch P2 have the same dimension. Due to a relation possessed by the head unit 4 and the component feed unit 6, it is possible to concurrently arrange the plurality of suction nozzles 3 above the plurality of component pickup positions 7*a*, and it is possible to concurrently hold and pick up a plurality of components 1 by use of the plurality of the suction nozzles 3.

(Component Mounting Operation Performed by Component Mounting Apparatus)

A mounting operation of each of the components 1 onto the board 2 executed in the component mounting apparatus 100 of the aforementioned construction will be described next. It is to be noted that the mounting operation is executed while being controlled by the control system in the component mounting apparatus 100.

First of all, in the component mounting apparatus 100 shown in FIG. 1, the board 2 onto which the components 1 are to be mounted is supplied to the board conveyance unit 9, conveyed from the right-hand side to the left-hand side in the illustrated X-axis direction by the board conveyance unit 9, and releasably held by the stage 5. Onto the board 2, thus supplied to the board conveyance unit 9, is supplied a bonding material of solder or the like by printing or a similar operation in order to allow the components 1 to be bonded to, for example, a plurality of electrodes (not shown) formed on the surface of the board 2. By mounting the components 1 onto the electrodes of the board 2 with interposition of the bonding material in the component mounting apparatus 100, electrical continuity between the components 1 and the electrodes of the board 2 can be obtained.

Next, a movement operation of the head unit 4 toward a place above the component feed unit 6 is started by the X-Y robot 8. In parallel with this movement operation of the head unit 4, a preparatory descent operation of one or a plurality of the suction nozzles 3 that picks up component or components 1 by suction and holding is started in the head unit 4. With regard to this preparatory descent operation, a tip portion of suction nozzle 3 is moved down to a height position where the tip portion does not interfere with other constituent sections arranged on the machine table 10 of the component mounting apparatus 100, in order to shorten a time necessary for holding and pickup of component 1 by the suction nozzle 3, and put into a descent standby state with the height position served as a descent standby height position (also as one example of a component holding standby height position). Further, in parallel with this movement operation of the head unit 4 and the preparatory descent operation of the one or the plurality of suction nozzles 3, there is started an operation to feed component 1 to component pickup position 7*a* in one or a plurality of component feed cassettes 7 where the holding and pickup of components 1 are performed in the component feed unit 6.

Subsequently, the movement operation of the head unit 4 by the X-Y robot 8 is completed, and the one or the plurality of suction nozzles 3 are positioned above the component pickup position 7*a* of the one or the plurality of component feed cassettes 7. Also, the component 1 positioned in the component pickup position 7*a* in each of the one or the plurality of component feed cassettes 7 is brought into a state in which it can be picked up by, for example, opening a shutter (not shown) or exposing stored component 1 by peeling off a cover tape that covers a carrier tape. Further, together with these operations, the descent operation of the one or the plurality of suction nozzles 3 put in the descent standby state is started in the head unit 4. When the tip portion(s) of the one or the plurality of suction nozzles 3 are brought into contact with an upper surface of respective components 1, sucking and holding is performed in accordance with this action. Subsequently, the ascent operation of the suction nozzles 3 is started to hold and pick up the components 1 from the respective component feed cassettes 7. To subsequently further perform pickup of a component 1 by another suction nozzle 3 provided for the head unit 4, this pickup can be performed by repeating the above-mentioned operation.

Next, an upward movement operation of the board 2 by the X-Y robot 8 is started in the head unit 4. Moreover, together with this movement operation of the head unit 4, a preparatory descent operation of the suction nozzle 3 that first performs the mounting operation of the component 1 is started to put the nozzle in the descent standby state in the descent standby height position. Subsequently, positional alignment of the component 1 sucked and held by the suction nozzle 3 with a mounting position of the component 1 on the board 2 is performed by a movement operation of the head unit 4 by the X-Y robot 8. Then, the suction nozzle 3 is further moved down from the descent standby height position to mount the component 1 onto the mounting position of the board 2. Subsequently, suction and holding of the component 1 by the suction nozzle 3 is released, in accordance with which the suction nozzle 3 is moved up. When components 1 held by other suction nozzles 3 of the head unit 4 are mounted onto the board 2, this mounting can be achieved by repeating the above-mentioned operation.

Subsequently, by repetitively executing the aforementioned component holding and pickup operation and component mounting operation a plurality of times, a plurality of components 1 are mounted onto the board 2. The board 2 on which the components 1 are mounted is released from holding by the stage 5, conveyed leftward in the illustrated X-axis direction by the board conveyance unit 9, and ejected from the component mounting apparatus 100.

Although not shown in FIG. 1, there may be a case where a component imaging device, that is able to capture an image of component 1 in a held state in which it is picked up from component feed cassette 7 and sucked and held by suction nozzle 3, is provided on the upper surface of the machine table 10. In this case, a state in which the component 1 is held by the suction nozzle 3 can be recognized on basis of the image captured by the component imaging device, and a posture of this held component 1 can be corrected on a basis of this result of recognition.

Moreover, each of the suction nozzles 3 provided for the head unit 4 may be rotatable around a central axis thereof. In this case, rotational movement is performed on basis of a mounting position and a posture of component 1 on the board 2 before a mounting operation after the component 1 is held and picked up.

(Construction of Control System)

Figure 3:
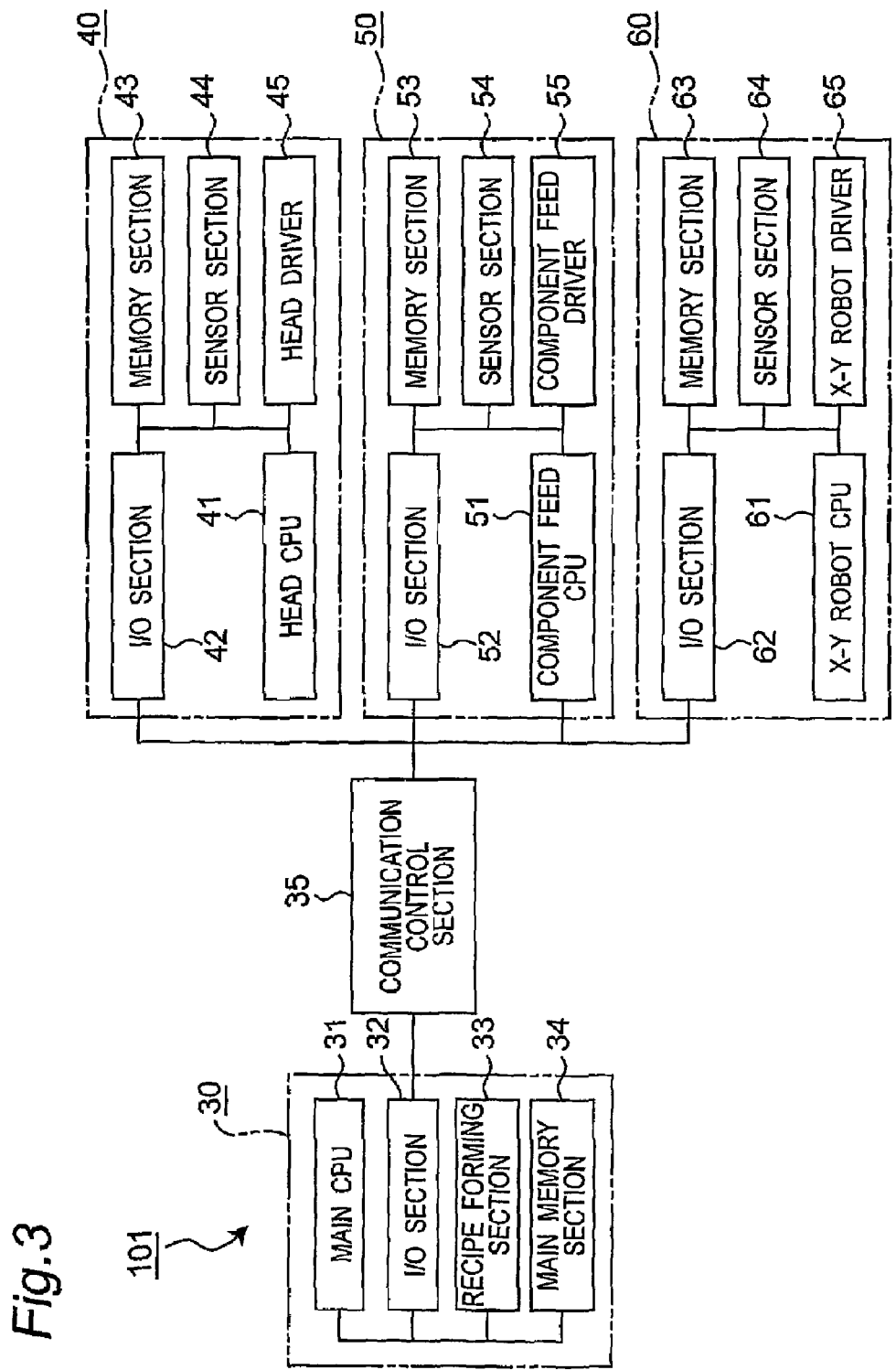
FIG. 3 is a control block diagram of a distributed control system provided for the component mounting apparatus of the first embodiment.

Construction of the control system provided for the component mounting apparatus 100 will be described next. The control system provided for the component mounting apparatus 100 does not adopt a "centralized control system" that intensively controls operation of a plurality of constituent sections by one control unit as in a control system of a conventional component mounting apparatus, but adopts a "distributed control system" that executes control of constituent sections by individually providing the constituent sections themselves with a control unit called a distribution unit, thereby making distributed units dialog (i.e., communicate) with one another and executing control of the constituent sections while correlating them with one another. FIG. 3 shows a control block diagram schematically showing construction of a distributed control system 101 that is one example of the above-mentioned control system. In the control block diagram shown in FIG. 3, only principal constituent sections provided for the distributed control system 101 are shown for sake of easy understanding of an explanation of the construction. Therefore, a detailed construction of the distributed control system 101 should not be interpreted as limited to the one shown in FIG. 3.

As shown in FIG. 3, the distributed control system 101 is provided with a head distribution unit 40 as one example of a head unit control section that is provided for the head unit 4 and controls operation of the head unit 4, a component feed distribution unit 50 as one example of a component feed unit control section that is provided for the component feed unit 6 and controls operation of the component feed unit 6, and an X-Y robot distribution unit 60 as one example of a moving unit control section that is provided for the X-Y robot 8 and controls operation of the X-Y robot 8. Moreover, the distributed control system 101 is provided with an MMC 30 as one example of a main control section that plays a generalized role of control of the distribution units (this is a general term for the head distribution unit 40, the component feed distribution unit 50 and the X-Y robot distribution unit 60, and the like hereinafter). Between the MMC 30 and each of the distribution units is provided a communication control section 35 (e.g., CAN communication control section) that is one example of a distribution unit and controls communications of information between the MMC 30 and each of the distribution units (serving as a communication interface). In contrast to an arrangement in which distribution units are provided for respective constituent sections (e.g., head unit) provided for the component mounting apparatus 100, the MMC 30 is provided on a main body side of the component mounting apparatus 100.

Moreover, a serial bus communication standard called CAN (Controller Area Network) is used as one example for informational communications in the distributed control system 101. By using this CAN, it becomes possible to execute one-to-many (i.e., master to others) communications with either one of the distribution units or the MMC 30 served as the master. Moreover, by filtering a message of information to be transferred in an input/output section on a reception side, it becomes possible to execute one-to-one pseudo-communications. That is, it becomes possible to execute communications of information as if a dialog is established between each of the distribution units and the MMC 30, and this is suitable for transmission of a recipe and an event as described later. In a case where only one distribution unit is provided for the distributed control system, the one-to-many communications as described above is not necessary. Therefore, it is possible to adopt a one-to-one serial communication system like RS422.

As shown in FIG. 3, the MMC 30 is provided with a recipe forming section 33 that forms recipes of an operational program for executing motion control executed in each of the distribution units, and an input/output (I/O) section 32 as one example of a recipe transmission section that is able to transmit each of formed recipes to the distribution units through the communication control section 35 and receive information transmitted from the distribution units through the communication control section 35. Further, the MMC 30 is provided with a main memory section 34 that retrievably stores recipes formed in the recipe forming section 33, information inputted from the input/output section 32, and the like, and a main CPU 31 that executes centralized control of operations of a recipe forming operation in the recipe forming section 33, input and output in the input/output section 32, and data storage, read, and the like in the main memory section 34.

Moreover, as shown in FIG. 3, the head distribution unit 40 is provided with an input/output section 42 that is able to input (receive) information of recipes and the like transmitted from the MMC 30, and output (transmit) information to other distribution units and the MMC 30 and a memory section 43 that retrievably stores information and data of a recipe and the like. Further, the head distribution unit 40 is provided with a head CPU 41 that has a function as a recipe executing section for executing a transmitted recipe, a head driver 45 that controls driving of an operation in the head unit 4 on basis of execution of the recipe, and a sensor section 44 that detects an amount of drive of an actual operation in the head unit 4. It is to be noted that the head CPU 41 controls an amount of drive by the head driver 45 on basis of the amount of drive detected by the sensor section 44.

Further, in the head distribution unit 40, the head CPU 41 has functions to form a timing signal called the "event" of a signal that represents an operational state on basis of a detection result of the sensor section 44 of an amount of drive control of the head unit 4 based on execution of the recipe, and transmit this formed event from the input/output section 42 to other distribution units (i.e., also having a function as an event forming section or a timing signal forming section). Moreover, the head CPU 41 also has a function to start or end execution of the recipe stored in the memory section 43 on basis of an event that has been formed by another distribution unit and transmitted.

Moreover, as shown in FIG. 3, the distribution units other than the head distribution unit 40 have similar constructions.

The component feed distribution unit 50 is provided with a component feed CPU 51 that executes recipes and forms events, a component feed driver 55 that performs a drive control of the operation of the component feed unit 6, a sensor section 54 that detects an actual amount of drive of the component feed unit 6, a memory section 53 that retrievably stores data of a recipe and the like, and an input/output section 52 that transmits and receives information of the recipe, event and the like. It can be considered a case where there exists no motor or the like to be driven in the component feed unit 6. In this case, it may be a case where the component feed driver 55 is not provided for the component feed distribution unit 50.

The X-Y robot distribution unit 60 is provided with an X-Y robot CPU 61 that executes recipes and forms events, an X-Y robot driver 65 that executes a drive control of operation of the X-Y robot 8, a sensor section 64 that detects an actual amount of drive of the X-Y robot 8, a memory section 63 that retrievably stores data of the recipe and the like, and an input/output section 62 that transmits and receives information of the recipe, event and the like.

By providing, for example, an IC that has a CAN communication function for each of the input/output sections 32, 42, 52 and 62, it becomes possible to execute CAN communications in the distributed control system 101.

Although the CAN communications are performed as described above in the distributed control system 101 according to the above description, the present invention is not limited only to the above case. For example, it may be a case where communications other than CAN are used.

(Contents of Motion Control in the Component Mounting Apparatus)

Next, before describing a control operation to be executed in the distributed control system 101 that has the aforementioned construction, contents of a plurality of operations (or processes) for component mounting executed in the component mounting apparatus 100 will be described with reference to a flow chart, that shows a component mounting procedure, shown in FIG. 4.

Figure 4:
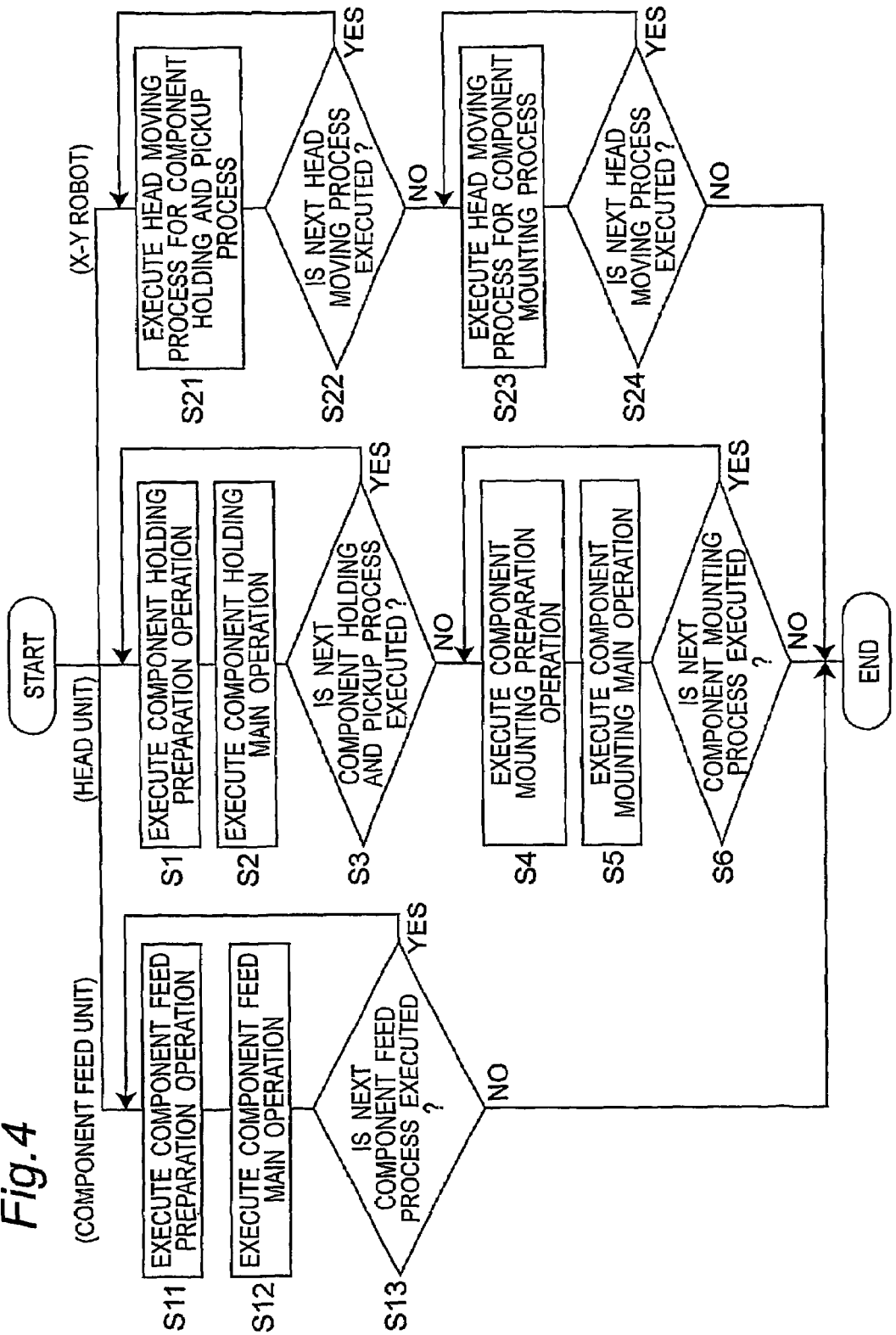
FIG. 4 is a flow chart of an operation of component mounting executed in the component mounting apparatus of the first embodiment.

The flow chart shown in FIG. 4 shows operation of the head unit 4 (flow shown in a central column of the flow chart of FIG. 4), operation of the component feed unit 6 (flow shown in the left-hand column of the same figure) and operation of the X-Y robot 8 (flow shown in the right-hand column of the same figure), during which component 1 fed from the component feed unit 6 is held and picked up by the head unit 4, transferred by the X-Y robot 8 and mounted onto the board 2.

First of all, paying attention to the operation of the head unit 4, the operation performed by the head unit 4 during component mounting includes mainly two processes. One process is a "component holding and pickup process" in which an operation of sucking and holding the component 1 by suction nozzle 3 to pick up the component from component feed cassette 7 is executed. The other process is a "component mounting process" in which an operation of mounting the component 1 that has been sucked and held onto the board 2 is executed. In the present first embodiment, the component holding and pickup process is one example of a component holding and pickup operation, and the component mounting process is one example of a component mounting operation.

Further, as shown in FIG. 4, this component holding and pickup process includes a "component holding preparational operation" (step S1) that is the aforementioned preparatory descent operation of the suction nozzle 3, and a "component holding main operation" (step S2) that is the operation of sucking and holding the component 1 by further moving down the suction nozzle 3 positioned in the descent standby height position, as a consequence of execution of the preparatory descent operation, and thereafter picking up the component 1 by moving up the nozzle. If the above component holding and pickup process (i.e., steps S1 and S2) is executed, then it is determined in step S3 whether or not to execute the component holding and pickup process, and steps S1 and S2 are repeated until the component holding and pickup process to be executed is entirely completed. When the process is entirely completed, the component mounting process is started.

Moreover, as shown in FIG. 4, the component mounting process includes a "component mounting preparational operation" (step S4) that is a preparatory descent operation of the suction nozzle 3 in a state in which it is holding the component 1, and a "component mounting main operation" (step 5) that is an operation of executing mounting of the component 1 by further moving down the suction nozzle 3 positioned in a descent standby height position, as a consequence of execution of the preparatory descent operation, so as to bond the component 1 onto the board 2, releasing suction and holding performed by the suction nozzle 3, and moving up the suction nozzle 3. If the above component mounting process (i.e., steps S4 and S5) is executed, then it is determined in step S6 whether or not to execute a next component mounting process, and steps S4 and S5 are repeated until the component mounting process to be executed is entirely completed. When the process is entirely completed, operation by the head unit 4 is completed.

Next, paying attention to operation of the component feed unit 6, a "component feed process" for retrievably feeding a component 1 from the component feed unit 6 during component mounting is executed in the component feed unit 6. In the present first embodiment, the component feed process is one example of a component feed operation. As shown in FIG. 4, the component feed process includes a "component feed preparational operation" (step S11) represented by a feed operation of the component 1 to the aforementioned component pickup position 7a (or its neighborhood) in the component feed cassette 7, and a "component feed main operation" (step S12) that is an operation of positioning the component 1 positioned in the component pickup position 7a (or its neighborhood) into a state in which the component can be picked up by, for example, opening the shutter (or opening the shutter by positioning the component from the neighborhood into the component pickup position 7a or a similar process). If the above component feed process (i.e., steps S11 and S12) is executed, then it is determined in step S13 whether or not to execute a next component feed process, and steps S11 and S12 are repeated until the component feed process to be executed is entirely completed. When the process is entirely completed, the component feed process is completed, and operation by the component feed unit 6 is completed.

Next, paying attention to operation of the X-Y robot 8, an operation to be executed by the X-Y robot 8 during the component mounting includes mainly two processes. One process is a "head moving process for the component holding and pickup process" (step S21) that is an operation of moving the head unit 4 toward a place above the component feed unit 6. The other process is a "head moving process for the component mounting process" (step S23) that is an operation of moving the head unit 4 toward a place above the board 2. In the present first embodiment, the head moving process for the component holding and pickup process is one example of a head moving operation for the component holding and pickup operation, and the head moving process for the component mounting process is one example of a head moving operation for the component mounting operation.

As shown in FIG. 4, if the head moving process for the component holding and pickup process is executed in step S21, then it is determined in step S22 whether or not to execute the head moving process for a next component holding and pickup, and step S21 is repeated until the process to be executed is entirely completed. When the process is entirely completed, the head moving process (step S23) for the component mounting process of a next process is started.

If the head moving process for the component mounting process is executed in step S23, then it is determined in step S24 whether or not to execute the head moving process for a next component mounting process, and step S23 is repeated until the process to be executed is entirely completed. When the process is entirely completed, operation by the X-Y robot 8 is completed.

(Control Operation of the Distributed Control System)

A principal control operation, during component mounting, in the aforementioned distributed control system 101 will be described next.

(Control Operation during the Component Holding and Pickup Process)

Figure 5:
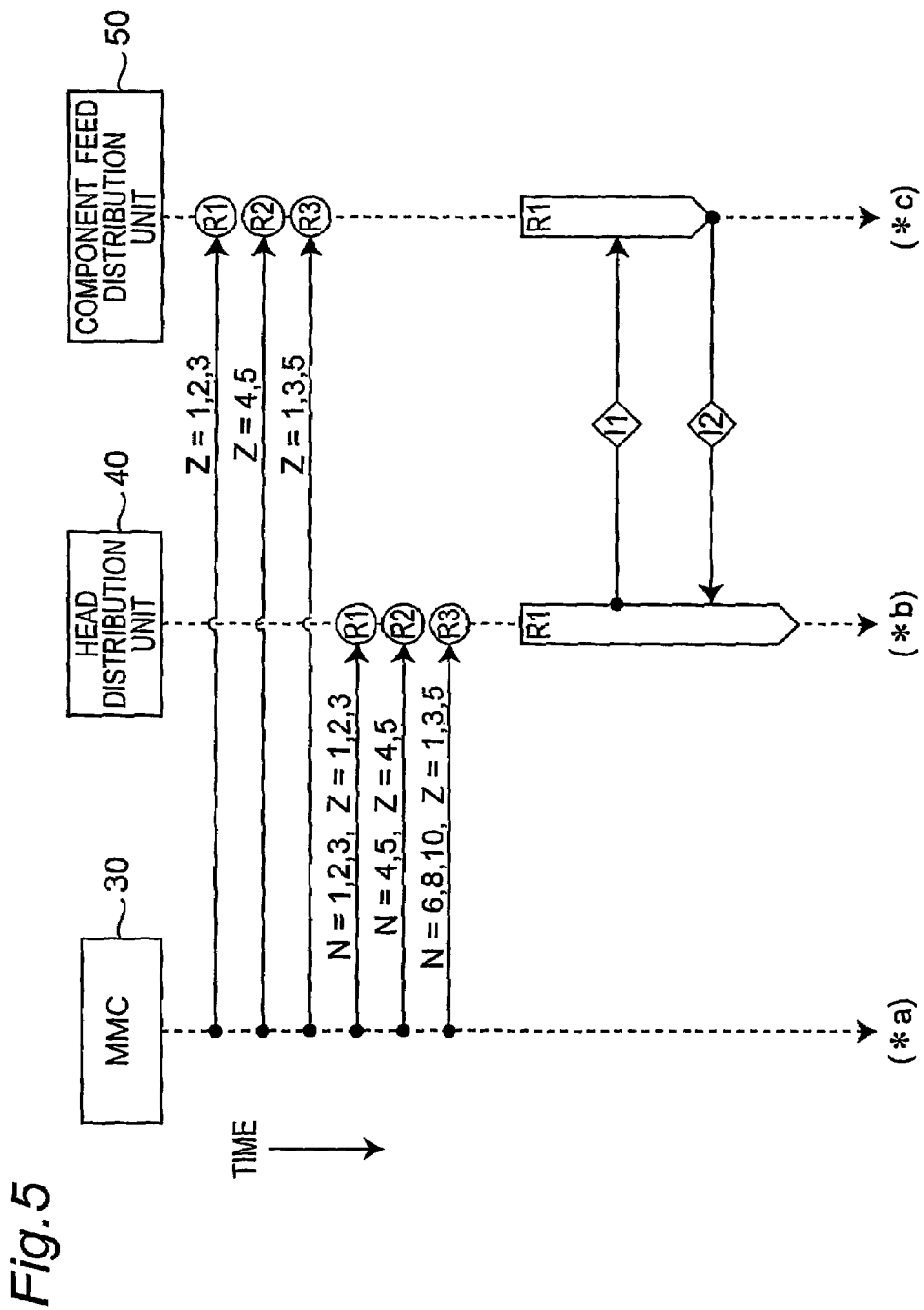
FIG. 5 is a schematic control flow chart of a component holding and pickup process.
Figure 6:
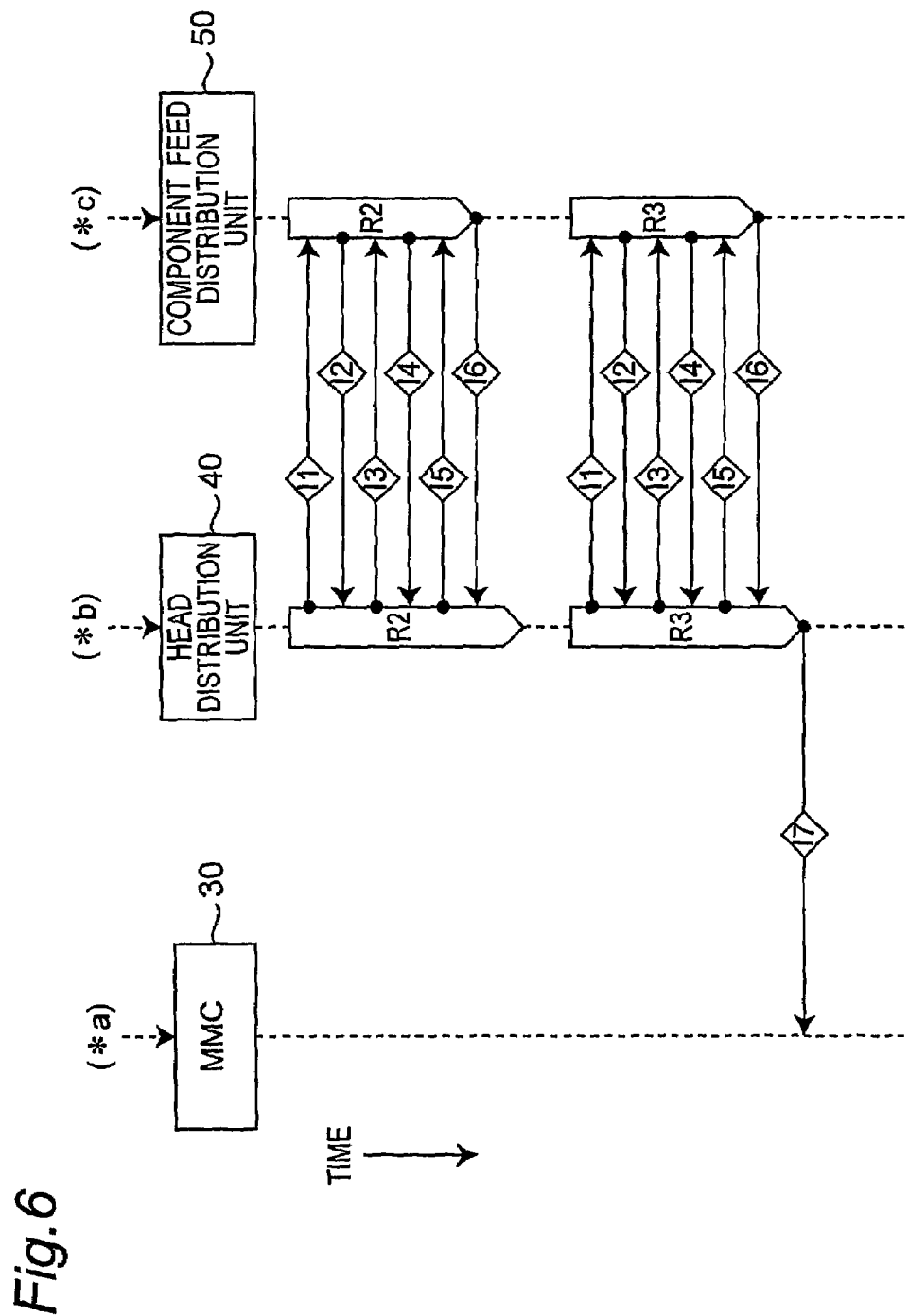
FIG. 6 is a control flow chart continued from FIG. 5.
Figure 7:
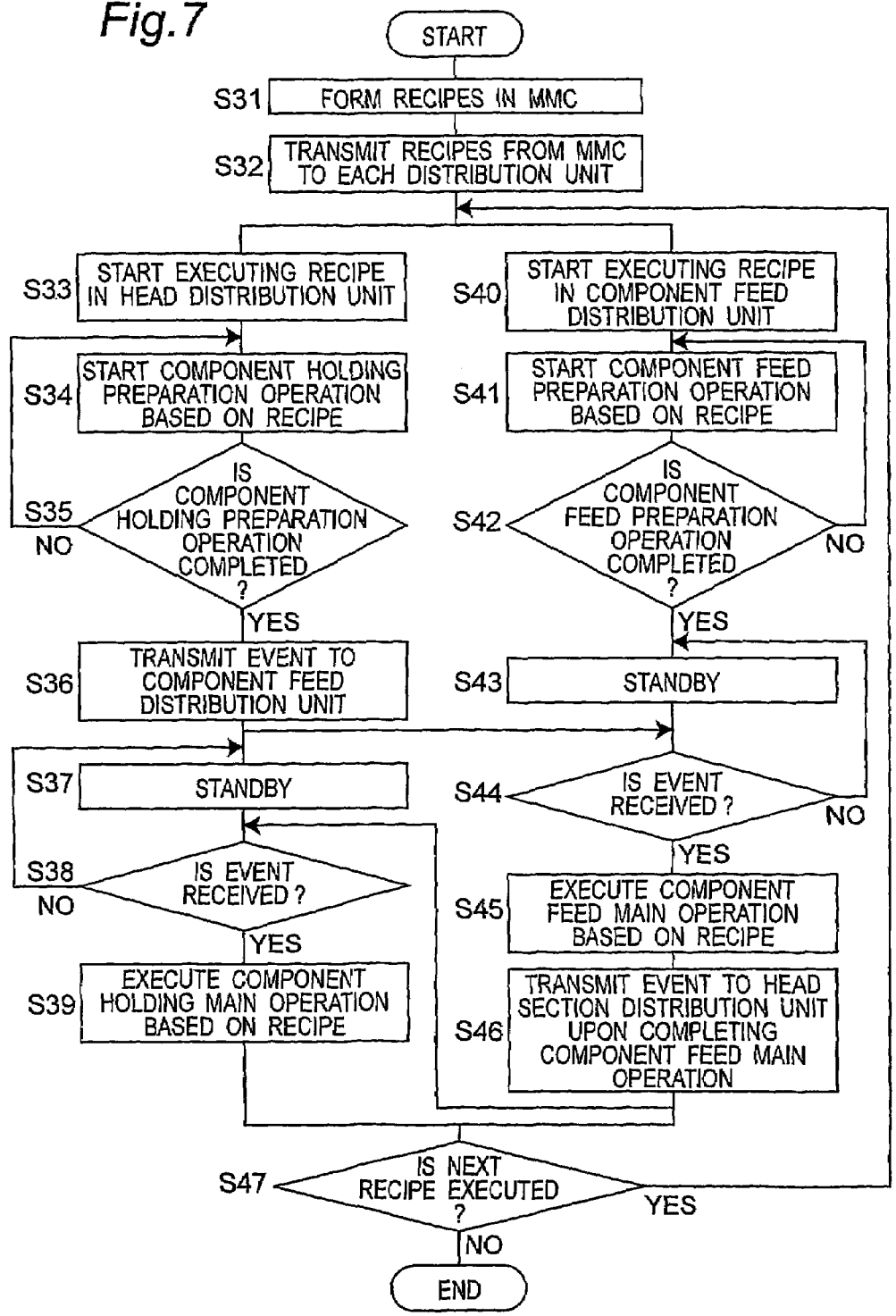
FIG. 7 is a flow chart showing a procedure of a control operation of the component holding and pickup process of FIG. 5.

First of all, a schematic explanatory flow chart schematically showing information communications, i.e., a transfer state of recipes and events between the MMC 30, the head distribution unit 40 and the component feed distribution unit 50 when the component holding and pickup process of components 1 from the component feed unit 6 by the head unit 4 is executed is shown in FIGS. 5 and 6, and a flow chart of an operational procedure is shown in FIG. 7. A plurality of recipes and events are handled in the following description. The plurality of recipes are indicated by R1 through R3, and the plurality of events are indicated by I1 through I7. Moreover, in FIGS. 5 and 6, when the ten suction nozzles 3 provided for the head unit 4 are used specified, for example, the suction nozzle 3-1 is indicated by "N=1" as a nozzle number. When the six component feed cassettes 7 provided for the component feed unit 6 are used specified, for example, the component feed cassette 7-2 is indicated by "Z=2" as a cassette number.

First of all, the plurality of recipes to be executed in the head distribution unit 40 and the component feed distribution unit 50 by the MMC 30 are formed in step S31 in FIG. 7, and these formed recipes are transmitted from the MMC 30 to the distribution units 40 and 50 in step S32.

Referring to a concrete example for explanation, as shown in FIG. 5, in a case where components 1 are held and picked up by one or a plurality of suction nozzles 3 provided for the head unit 4 by executing the component holding and pickup process three times, and thereafter the component mounting process is executed by the head unit 4, there is a practice of forming a recipe for every component holding and pickup process, i.e., forming three recipes R1, R2 and R3 in the MMC 30.

Recipe R1 for the component feed process transmitted to the component feed distribution unit 50 is formed containing information of the cassette number like, for example, "Z=1, 2, 3" (indicating the component feed cassettes 7-1, 7-2 and 7-3 in this case) so that the component feed cassettes 7 (or the component pickup positions 7a), from which the components 1 are to be picked up during the component holding and pickup process executed at the first time, can be recognized by the component feed distribution unit 50. Likewise, recipe R2 is formed containing information of the number of the cassette from which the components 1 are to be picked up in a next component holding and pickup process like "Z=4, 5", and the recipe R3 is formed containing the information of "Z=1, 3, 5".

On the other hand, recipe R1 for the component holding and pickup process transmitted to the head distribution unit 40 is formed containing information of the nozzle number like, for example, "N=1, 2, 3" (indicating the suction nozzles 3-1, 3-2 and 3-3 in this case) so that the suction nozzles 3 to suck and hold the components 1 during the component holding and pickup process executed at the first time can be recognized by the head distribution unit 40. Likewise, recipe R2 is formed containing the information of "N=4, 5", and recipe R3 is formed containing the information of "N=6, 8, 10". Moreover, recipes R1 through R3 transmitted to the head distribution unit 40 further contain information of the cassette number as to from which component feed cassettes 7 the suction nozzles 3 pick up the components 1 as shown in FIG. 5, in addition to the information of the nozzle numbers.

Moreover, with regard to a sequence of transmitting recipes from the MMC 30 to the head distribution unit 40 and the component feed distribution unit 50, priority may be given to either of them. However, with regard to an entire component mounting operation, considering the fact that the component feed unit 6 executes only the component feed process in contrast to the fact that the head unit 4 is required to execute the two processes of the component holding and pickup process and the component mounting process, it is preferable to first execute recipe transmission to the head distribution unit 40 in terms of reducing influence of time required for the recipe transmission exerted on component mounting, and achieving a more efficient recipe transmission.

Next, as shown in FIG. 7, execution of recipe R1 to be executed first, out of received recipes R1 through R3, is started in the head distribution unit 40 in step S33, and the execution of recipe R1 to be executed first, out of the received recipes R1 through R3, is started in the component feed distribution unit 50 in step S40. In each of the distribution units 40 and 50, start of recipe R1 may be executed by determining whether or not this start is permitted by corresponding CPU 41 or 51 on basis of received recipe R1. Otherwise, the start may be executed by transmitting a command signal for starting first recipe R1 from the MMC 30 to each of the distribution units 40 and 50 aside from transmission of recipes R1 through R3.

Subsequently, as shown in FIG. 7, the component holding preparational operation is started in the head distribution unit 40 on basis of recipe R1 (step S34). In concrete, a descent operation of the suction nozzles 3 of the nozzle numbers N=1, 2 and 3 to the descent standby height position is started by information of the nozzle numbers contained in the recipe R1. On the other hand, in the component feed distribution unit 50, the component feed preparation operation is started on basis of recipe R1 (step S41). In concrete, a feed operation of the components 1 to the component pickup positions 7a is started in the component feed cassettes 7 of the cassette numbers Z=1, 2 and 3 by information of the cassette numbers contained in recipe R1. Subsequently, it is determined in step S42 whether or not the component feed preparational operation is completed, i.e., whether or not the components 1 are positioned in the component pickup positions 7a in the component feed cassettes 7, and the operation is continuously executed until the above operation is completed. If it is confirmed that the above operation is completed, then the component feed cassettes 7 are put in a standby state in step S43.

In the head distribution unit 40, it is determined in step S35 whether or not the component holding preparational operation is completed, i.e., whether or not the suction nozzles 3 have been moved down to the descent standby height position, and the operation is continuously executed until this completion. If it is confirmed that the operation is completed, then event I1 is transmitted from the head distribution unit 40 to the component feed distribution unit 50 in step S36, thereby making the component feed distribution unit 50 recognize completion of the operation. After event I1 is transmitted, the head distribution unit 40 is put in the standby state (step S37).

On the other hand, in the component feed distribution unit 50, the standby state is continued until the event I1 is received from the head distribution unit 40 (step S44). If event I1 is received, then the component feed main operation is executed on basis of recipe R1 (step S45). Concretely, in order to allow the component 1 positioned in the component pickup position 7a in each of the component feed cassettes 7 to be picked up by the suction nozzle 3, performed is an operation of, for example, putting the shutter that protects the component 1 into an open state. Subsequently, when the component feed main operation is completed, event I2 for transmitting information of the event that the component 1 is put in the state in which it can be picked up in each of the component feed cassettes 7 is transmitted from the component feed distribution unit 50 to the head distribution unit 40 (step S46). A reason for start of the component feed main operation after reception of event I1 in the component feed cassette 7 is as follows. That is, for example, if the component feed main operation for opening the shutter or peeling off the cover tape is executed, the component 1 can be put into a state in which it can be picked up, whereas the component 1 is put in a state in which it is more prone to external influence. Therefore, a possibility that the component 1 may receive this influence is reduced by shortening a duration of this state as much as possible. By so doing, accuracy of holding and picking up the component 1 can be improved.

In the head distribution unit 40, if reception of the event I2 is confirmed in step S38, then the standby state until then is released, and the component holding main operation is executed on the basis of recipe R1 (step S39). In concrete, the suction nozzles 3-1, 3-2 and 3-3 positioned in the descent standby height position are further moved down to suck and hold the components 1 in the component pickup positions 7a of the respective component feed cassettes 7-1, 7-2 and 7-3, and thereafter moved up to execute the holding and pickup operation of the components 1. As described above, by starting execution of the component holding main operation upon receiving event I2, it becomes possible to subject the components 1, which are allowed to be reliably held and picked up, to the above operation and previously prevent occurrence of an error such as interference with the component feed cassettes 7 due to descent of the suction nozzles 3.

Subsequently, it is determined in step S47 whether or not to execute a next recipe. With regard to already received recipe R2, recipe R2 is executed similarly to the aforementioned procedure in the head distribution unit 40 and the component feed distribution unit 50. As shown in FIG. 6, in executing the component holding and pickup process based on this recipe R2, suction and holding and pickup of components 1 from the component feed cassettes 7 of the "cassette numbers Z=4, 5" by the suction nozzles 3 of the "nozzle numbers N=4, 5" is executed. Moreover, in executing the component holding and pickup process based on subsequent recipe R3, suction and holding and pickup of components 1 from the component feed cassettes 7 of the "cassette numbers Z=1, 3, 5" by the suction nozzles 3 of the "nozzle numbers N=6, 8, 10" is executed. If execution of recipe R3 in the head distribution unit 40 is completed, then event I7 for transmitting information of this completion is transmitted from the head distribution unit 40 to the MMC 30, and it is recognized that the component holding and pickup process based on all recipes R1 through R3 is completed in the MMC 30.

Figure 8:
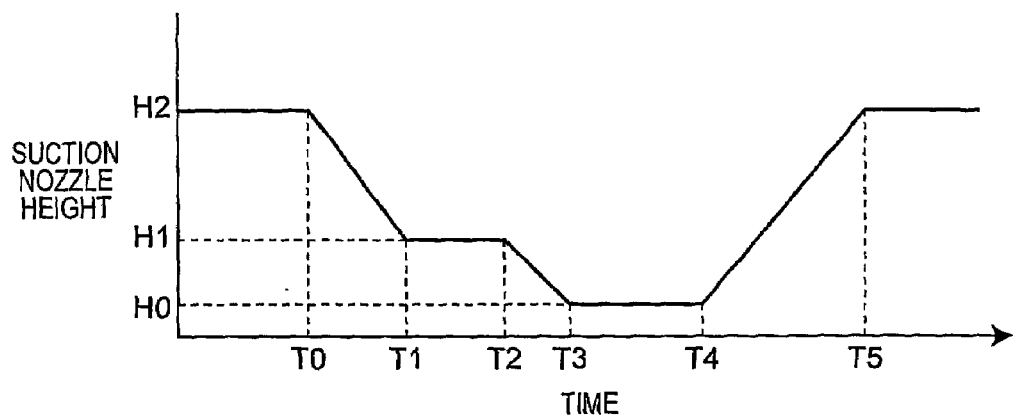
FIG. 8 is a timing chart showing a state in which a height position is changed by elevation of a suction nozzle in the component holding and pickup process of FIG. 5.

As shown in FIG. 5, an event transferred between the head distribution unit 40 and the component feed distribution unit 50 may be executed by transferring a plurality of events I3 through 16 as shown in FIG. 6 instead of transferring one event I1 and one event I2 as shown in FIG. 5. For example, contents and transmission timing of the aforementioned events I1 through I6 will be described in relation to a tip height position of the suction nozzle 3 shown in FIG. 8. FIG. 8 shows a relationship between tip height positions H0 through H2 and time T0 to T5 when an arbitrary suction nozzle 3 executes a component holding and pickup process.

As shown in FIG. 8, the suction nozzle 3 positioned in upper end height position H2 in an elevation height position (or elevation position) is moved down during time division T0 through T1 and positioned in descent standby height position H1 at time T1. At this time, for example, event I1 is transmitted to transfer this information to the component feed distribution unit 50. Upon receiving this event I1, the component feed distribution unit 50 can start a component feed main operation.

Subsequently, during time division T2 to T3, the suction nozzle 3 is moved down from the descent standby height position H1 to suction and holding height position H0, and suction and holding of component 1 is executed. In accordance with timing of this time T2, event I3 intended for transferring, for example, information that a final descent from the descent standby height position H1 starts is transmitted. The above is because it is required to execute a final operation for putting the component 1 into a state in which the component can be held by peeling off the cover tape immediately before the suction and holding depending on a type of components 1 accommodated in the component feed cassette 7.

The suction nozzle 3, which is sucking and holding the component 1, starts moving up at time T4, and if the nozzle is positioned in the upper end height position H2, then, for example, event I5 that transfers information of this state, is transmitted to the component feed distribution unit 50. In the component feed distribution unit 50 that has received this event I5, a feed operation of a next component 1 can be started on the basis of this event I5. In the component feed distribution unit 50 that has received events I1, I3 and I5, certain operation may be executed on the basis of each of these events. When no operation is necessary depending on a type of accommodated component 1, the operation may not be executed. Necessity or non-necessity of the operation is determined by the component feed CPU 51 on the basis of a received recipe. Moreover, when a certain operation is executed on the basis of received events I1, I3 and I5, the component feed distribution unit 50 may transmit events I2, I4 and I6 based on the operation to the head distribution unit 40 as shown in FIG. 6.

Figure 9:
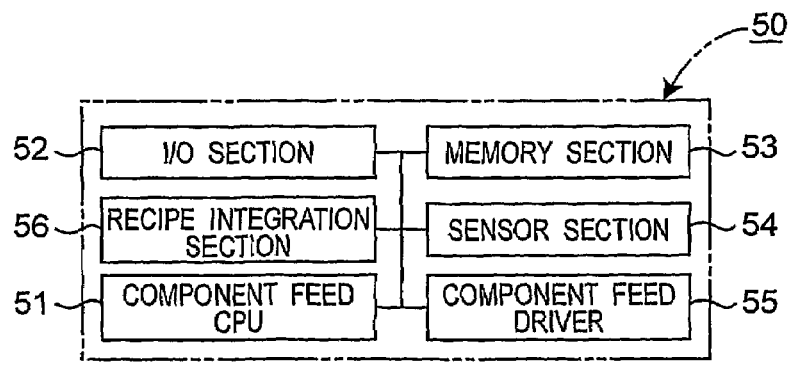
FIG. 9 is a control block diagram according to a modification example of a component feed distribution unit in the control block diagram of the distributed control system of FIG. 3.

Moreover, the component feed distribution unit 50 may be further provided with a recipe integration section 56 that has a function to integrate a plurality of recipes on the basis of contents as shown in the block diagram of FIG. 9 in place of the construction of the block diagram shown in FIG. 3. In the above case, for example, the "cassette numbers Z=1, 2, 3" in recipe R1 and the "cassette numbers Z=4, 5" in recipe R2 received by the component feed distribution unit 50 are integrated by the recipe integration section 56. A feed operation of the components 1 is simultaneously executed in the component feed cassettes 7 of the "cassette numbers Z=1, 2, 3, 4, 5" according to an integrated recipe of recipes R1 and R2, thereby allowing a more efficient component feed operation to be executed.

(Operation to Cope with Error Generated in the Component Holding and Pickup Process)

An example of a control operation to cope with an operational error generated after recipes R1 through R3 are transmitted from the MMC 30 to each of the head distribution unit 40 and the component feed distribution unit 50 during the component holding and pickup process will be described with reference to the schematic flow chart shown in FIG. 10.

Figure 10:
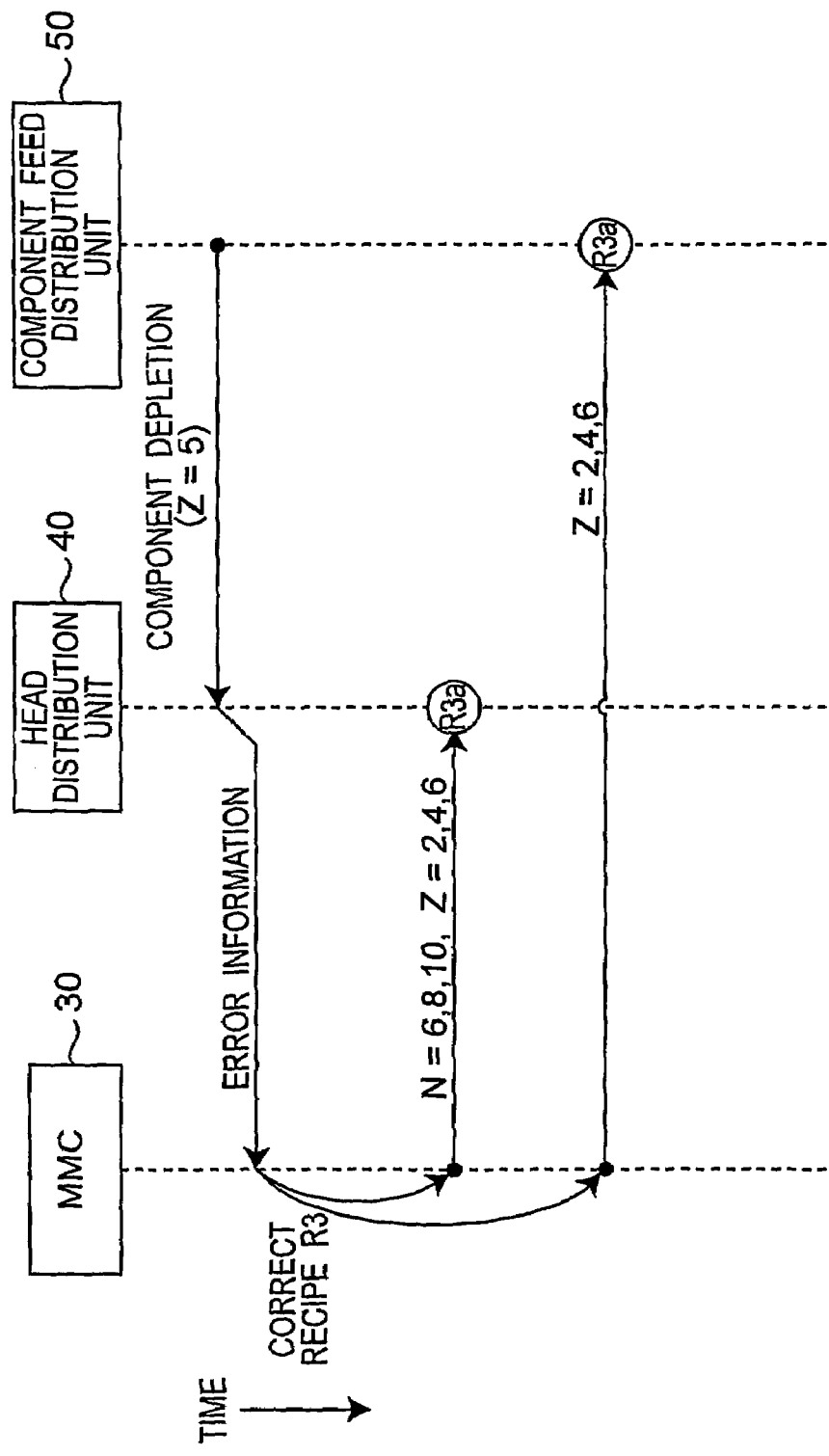
FIG. 10 is a control flow chart showing a case where an error occurs in the component holding and pickup process.

As shown in FIG. 10, when, for example, component depletion occurs as the aforementioned operational error in the component feed cassette 7-5 of the cassette number Z=5 in the component feed unit 6, this error information of component depletion is transmitted from the component feed distribution unit 50 to the head distribution unit 40 and the MMC 30. In a case where, for example, recipes R1 and R2 have been executed and recipe R3 has not yet been executed in the head distribution unit 40 that has received this error information, it is determined by the head CPU 41 that the information of the "cassette numbers Z=1, 3, 5" of the received recipe R3 and the error information of the "component depletion cassette number Z=5" overlap with each other, and execution of recipe R3 is awaited for its start.

On the other hand, the MMC 30 comprehensively determines the component feed cassette 7 that accommodates components 1 of the same type as that of the component feed cassette 7-5 of the cassette number Z=5 where component depletion has occurred, the nozzle number of the suction nozzle 3 that performs the suction and holding and so forth on the basis of the error information, corrects recipe R3 as, for example, a recipe R3a (correction is executed in the recipe forming section 33), and transmits a resulting recipe to the distribution units 40 and 50 (transmission from the input/output section 32).

In concrete, the MMC 30 preparatorily receives input of information capable of recognizing in advance a type and characteristics of the components 1 accommodated in the component feed cassettes 7 in the component feed unit 6 correspondingly by, for example, the main memory 34 shown in FIG. 3 or a database or the like (not shown in FIG. 3). Upon receiving the error information, the main CPU 31 retrieves the information of the component feed cassette 7 from the main memory 34 or the database and determines which component feed cassette 7 accommodates the components 1 of the same type and same characteristics as those of the components 1 stored in the component feed cassette 7-5 or the components 1 that can be used as a substitute. Recipe R3 is corrected to recipe R3a in the recipe forming section 33 on the basis of a result of this determination, and recipe R3a is transmitted from the input/output section 32 to the distribution units 40 and 50.

As a result, information of, for example, "the nozzle numbers N=6, 8, 10 and the cassette numbers Z=2, 4, 6" is transmitted as corrected recipe R3a to the head distribution unit 40, while information of "the cassette numbers Z=2, 4, 6" is transmitted as corrected recipe R3a to the component feed distribution unit 50. Subsequently, already received previous recipe R3 is replaced by corrected recipe R3a and each operation is executed on the basis of corrected recipe R3a in the distribution units 40 and 50.

If the MMC 30 determines that an already transmitted recipe cannot be corrected on the basis of the transmitted error information, then the MMC 30 may transmit a signal to skip execution of the recipe to the distribution units 40 and 50 or form and transmit a new recipe to the distribution units 40 and 50.

(Control Operation in the Component Mounting Process)

Figure 11:
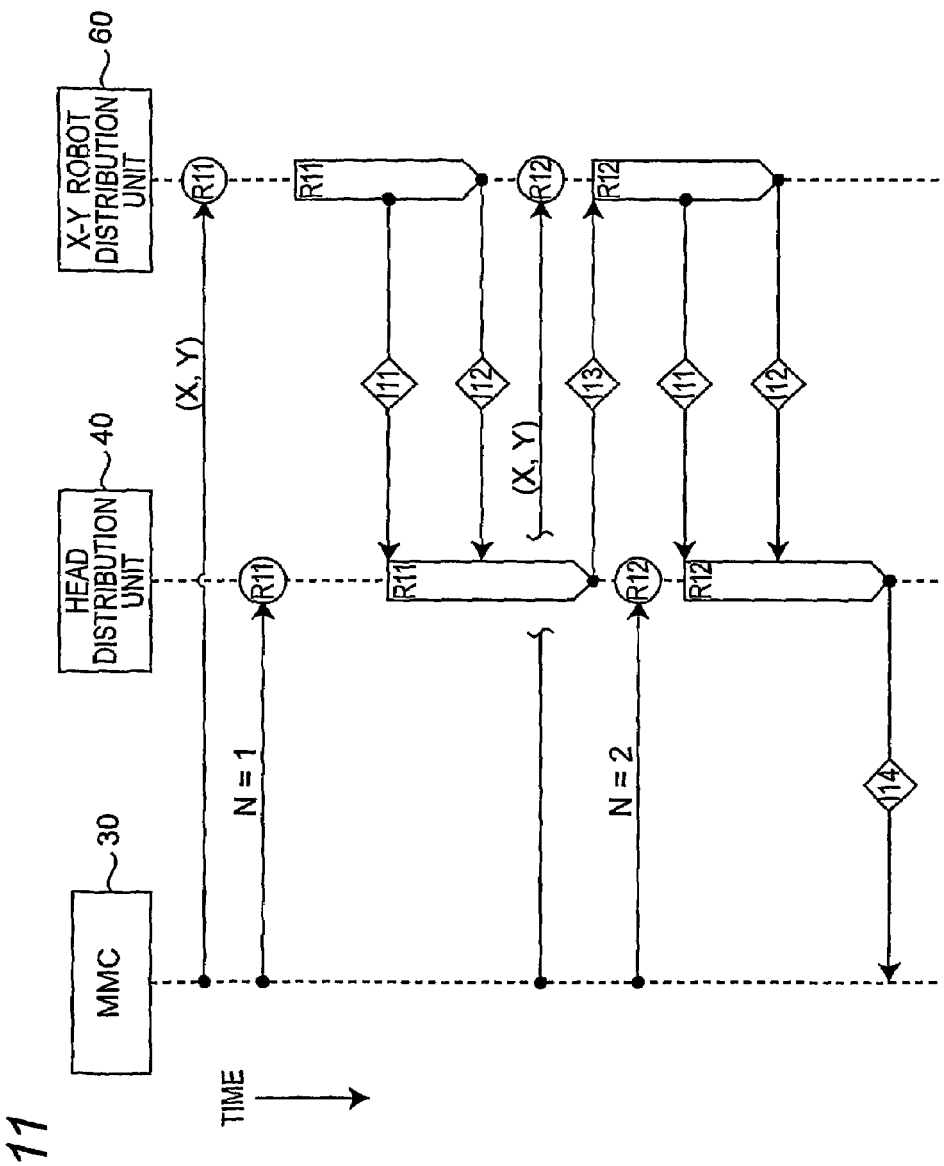
FIG. 11 is a schematic control flow chart of a component mounting process.
Figure 12:
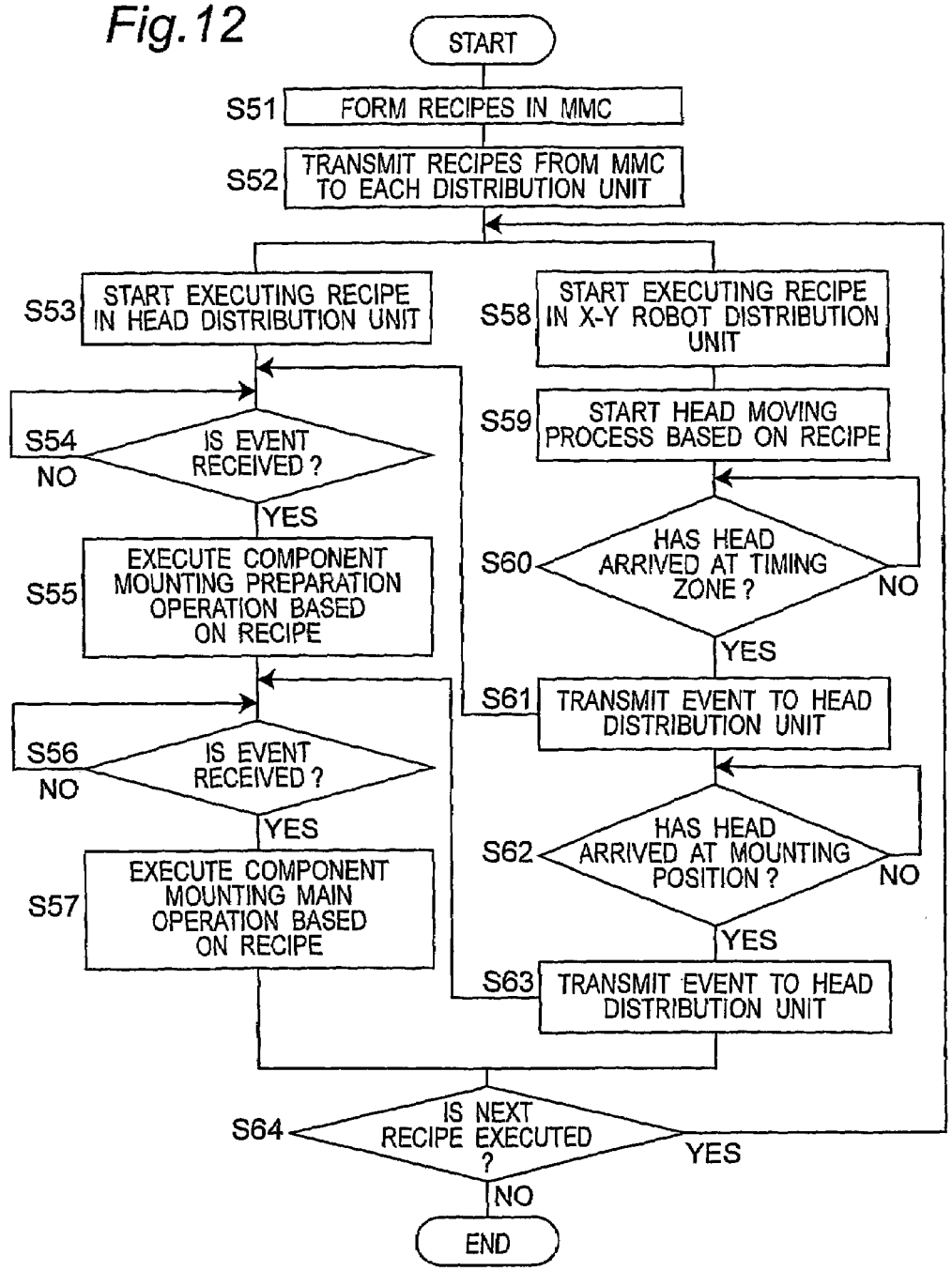
FIG. 12 is a flow chart showing a procedure of a control operation of the component mounting process of FIG. 11.

Next, a schematic explanatory flow chart schematically showing information communications, i.e., a transfer state of recipes and events between the MMC 30, the head distribution unit 40 and the X-Y robot distribution unit 60 when a component mounting process of mounting the components 1 held by the head unit 4 onto the board 2 is executed is shown in FIG. 11, and a flow chart of this operational procedure is shown in FIG. 12. Moreover, a chart of a relationship between operation of the X-Y robot 8 and operation of the suction nozzle 3 for explaining a transmission timing of events that are transmitted and received between the head distribution unit 40 and the X-Y robot distribution unit 60 is shown in FIG. 13.

A relationship between a movement operation of the head unit 4 by the X-Y robot 8 and an elevation operation of the suction nozzle 3 for component mounting will be described first with reference to the schematic explanatory view shown as one example in FIG. 13. In FIG. 13, an upper row shows a relationship between occurrence of X-Y movement of the head unit 4 by the X-Y robot 8 and time, while a lower row shows a relationship between a tip height position of the suction nozzle 3 during the elevation operation for component mounting in the head unit 4 and time. For sake of easy understanding of a relationship between the upper row and the lower row, a time (time T0 to T6) base is shown in common.

Figure 13:
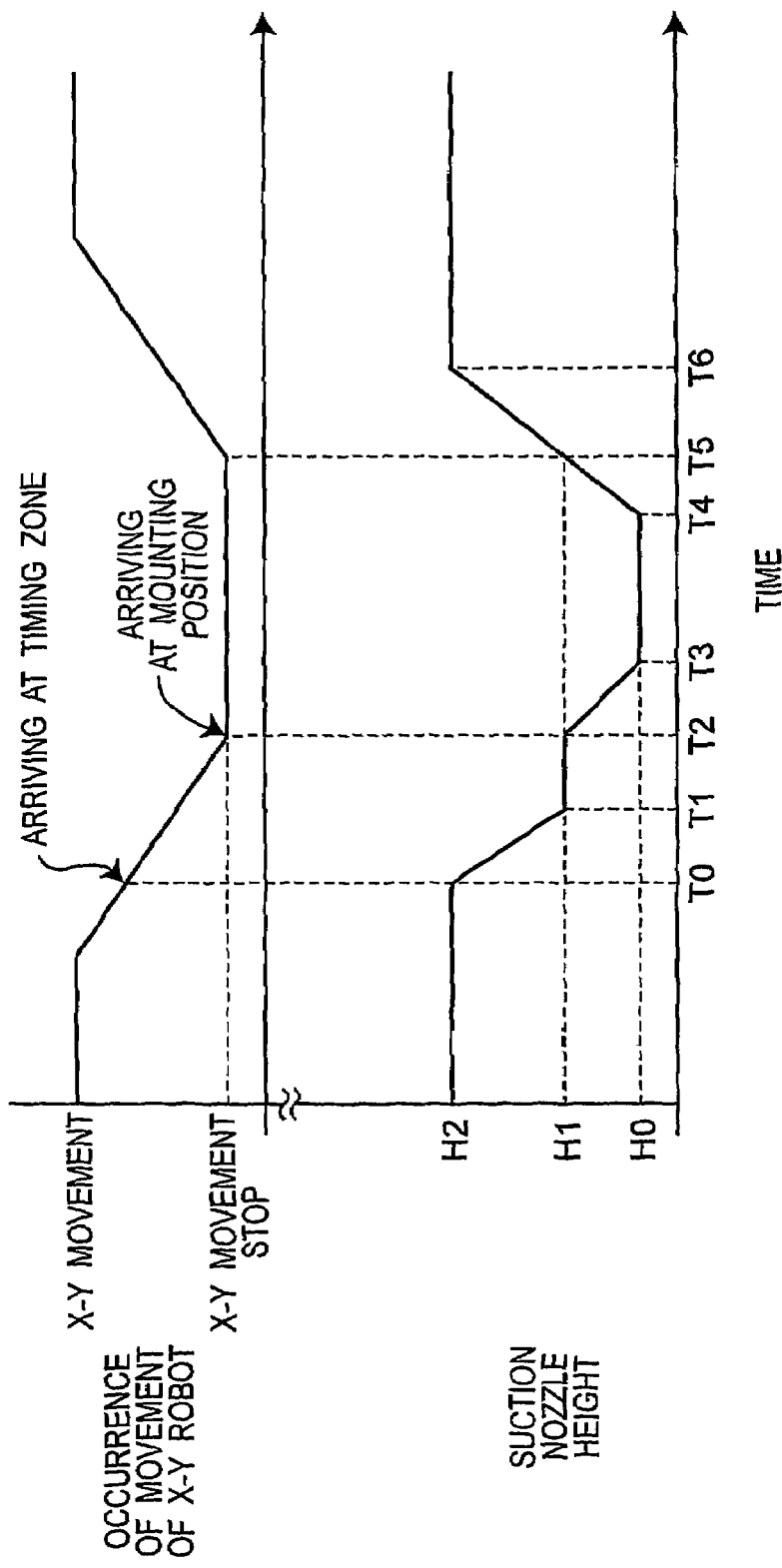
FIG. 13 is a timing chart showing a relationship between a head unit moving operation performed by an X-Y robot and a suction nozzle elevating operation in the component mounting process of FIG. 11.

As shown in FIG. 13, the head unit 4 is moved in the X-axis direction or the Y-axis direction (hereinafter assumed as X-Y movement) toward a place above a mounting position of component 1 on board 2 by the X-Y robot 8, and the suction nozzle 3 that performs the component mounting arrives at a region called a "timing zone" that is a position (prescribed region) within a prescribed range in the vicinity of the mounting position inclusive at time T0 with a travel speed thereof decelerated. If arrival at this timing zone is recognized by the head distribution unit 40 by transmission of an event described later, then descent of the suction nozzle 3 positioned in the upper end height position H2 of the elevation is started, and descent is temporarily stopped when the nozzle is positioned in the descent standby height position H1 at time T1.

Subsequently, if the suction nozzle 3, which is continuing the X-Y movement, arrives at the component mounting position at time T2, then movement of the head unit 4 by the X-Y robot 8 is stopped. If arrival at this component mounting position is recognized by the head distribution unit 40 by transmission of an event described later, then descent of the suction nozzle 3 positioned in the descent standby height position H1 is started and positioned in the lower end height position H0 at time T3, and the component 1 that is sucked and held is bonded to the component mounting position of the board 2. Subsequently, suction and holding of the component 1 by the suction nozzle 3 is released, and ascent of the suction nozzle 3 is started at time T4. If an event that the suction nozzle 3 has arrived at the descent standby height position H1 at time T5 is recognized by the X-Y robot distribution unit 60 by transmission of an event or the like, then movement of the head unit 4 by the X-Y robot 8 is started. Subsequently, the suction nozzle 3 is positioned in the upper end height position H2 at time T6.

A method for determining (setting) the timing zone is described here. In order to shorten a time to be spent on an operation of component mounting, it is desired to keep a height of the suction nozzle 3 during the X-Y movement as low as possible and reduce an amount of descent of the suction nozzle 3 after arrival at the component mounting position. However, in order to perform mounting of the component 1 onto the board 2, for example, after a process of picking up the component from the component feed unit 6, the X-Y movement is required to be performed with the suction nozzle 3 elevated to a height position where obstacles such as conveyance rails of the board conveyance unit 9 and the like located between the component pickup position 7*a* and the component mounting position do not interfere with the suction nozzle 3 and the component 1 that is sucked and held. The timing zone is determined taking into account positions of these obstacles and a size of the component 1 that is being sucked and held by the suction nozzle 3. By detecting arrival at this timing zone, it is possible to recognize the fact that the suction nozzle 3 has been moved into an area above the board 2, where the suction nozzle 3 can be securely moved down to the descent standby height position H1.

It is to be noted that this timing zone is not always necessary. For example, in a case where a mechanically highest position is the conveyance rails on the machine table 10, and a height of the component 1 already mounted on the board 2 is higher than the conveyance rails, the suction nozzle 3 cannot be moved down because the nozzle has moved over the conveyance rails. In the above case, the suction nozzle 3 is moved down from H2 to H0 in one operation when the timing zone=0 (zero), i.e., after the suction nozzle 3 has arrived at the component mounting position.

Reference is made by using the schematic explanatory flow chart of FIG. 11 and the flow chart of FIG. 12.

First of all, recipes to be executed by the head distribution unit 40 and the X-Y robot distribution unit 60 are formed in the MMC 30 in step S51 of FIG. 12, and these formed recipes are transmitted from the MMC 30 to the distribution units 40 and 60 in step S52.

Referring to a concrete example for explanation, as shown in FIG. 11, in a case where, for example, components 1 are held by a plurality of suction nozzles 3 in the head unit 4, recipes R11 and R12 are formed for every component mounting process executed by the suction nozzles 3 and transmitted before a start of each component mounting process.

Recipe R11 for a component mounting process transmitted to the head distribution unit 40 includes information of the nozzle number like, for example, "N=1" so that the suction nozzle 3 that first executes the component mounting process can be recognized by the head distribution unit 40. Likewise, recipe R12 to be executed next includes information of "N=2".

On the other hand, recipe R11 for the head moving process transmitted to the X-Y robot distribution unit 60 includes positional information of the mounting position on the board 2 of the component 1 held by the suction nozzle 3 that first executes the component mounting process (or positional information of a relocation position for movement to the mounting position) like, for example, "(X, Y)" in the form of X-Y coordinates, and recipe R12 also includes information in a similar form.

Moreover, with regard to a sequence of transmitting recipes from the MMC 30 to the distribution units 40 and 60, priority may be given to either of them. However, considering the fact that component mounting with descent of the suction nozzle 3 cannot be performed unless the X-Y movement is performed so that the head unit 4 is positioned above the component mounting position, it is preferable to first execute a recipe transmission to the X-Y robot distribution unit 60 in terms of more efficiently executing the component mounting.

Next, as shown in FIG. 12, execution of received recipe R11 is started in the X-Y robot distribution unit 60 in step S58, and execution of received recipe R11 is started in the head distribution unit 40 in step S53. The start of recipe R11 in the distribution units 40 and 60 may be executed after determining whether or not the start is permitted by the CPU 41 or 61 on the basis of received recipe R11. Otherwise, the start may be executed by transmitting a command signal for starting recipe R11 from the MMC 30 to the distribution units 40 and 60 aside from transmission of recipe R11.

Subsequently, as shown in FIG. 12, the head moving process for the component mounting process is started in the X-Y robot distribution unit 60 on the basis of recipe R11 (step S59). In concrete, X-Y movement by the X-Y robot 8 is started so that the head unit 4 is positioned above the component mounting position. Subsequently, if it is confirmed that the head unit 4 has arrived at an inside of the timing zone by the X-Y movement (step S60), then event I11 is transmitted from the X-Y robot distribution unit 60 to the head distribution unit 40 for a purpose of transmitting information of this arrival (step S61).

On the other hand, in the head distribution unit 40, a start of operation based on recipe R11 is in a standby state until event I11 from the X-Y robot distribution unit 60 is received in step S54. Upon receiving event I11, execution of the component mounting preparation operation is started on the basis of recipe R1. In concrete, the suction nozzle 3 of the nozzle number N=1 is moved down from the upper end height position H2 to the descent standby height position H1.

Together with the above operation, in the X-Y robot distribution unit 60 that is continuously executing control of the X-Y movement, it is determined whether or not a suction nozzle has arrived at a place above the component mounting position (step S62). If such arrival is determined, event I12 for transferring information of the arrival is transmitted to the head distribution unit 40.

In the head distribution unit 40, descent of the suction nozzle 3 is put in a standby state in the descent standby height position H1 until event I12 is received in step S56. Upon receiving event I12, execution of the component mounting main operation is started on the basis of recipe R11 (step S57). In concrete, the suction nozzle 3 of the nozzle number N=1 is moved down from the descent standby height position H1 to the lower limit height position H0, and the component 1 that is sucked and held is bonded to the component mounting position of the board 2. Subsequently, the suction nozzle 3 is moved up with suction and holding of the component 1 by the suction nozzle 3 released, and the component 1 is mounted onto the board 2.

Subsequently, it is determined whether or not to receive and execute a next recipe in step S64. When this recipe is executed, the aforementioned procedure is repeated. When this recipe is not executed, the component mounting process ends.

Instead of determining whether or not execution of the next recipe is permitted in step S64 as described above, the MMC 30 may transmit next recipe R12 to the X-Y robot distribution unit 60 after execution of step S63 as shown in FIGS. 11 and 12. In the above case, as shown in FIG. 11, an event I13 is transmitted from the head distribution unit 40 to the X-Y robot distribution unit 60 for a purpose of transferring information when elevating suction nozzle 3 is moved up to the descent standby height position H1 after mounting of the component 1, and execution of next recipe R12 can be started on the basis of reception of event I13 in the X-Y robot distribution unit 60, thereby allowing the component mounting process to be executed more efficiently. Subsequently, next recipe R12 is further transmitted from the MMC 30 to the head distribution unit 40 put in a state in which the first component mounting process is completed, and recipe R12 is executed awaiting for reception of event I11 from the X-Y robot distribution unit 60. If the component mounting process based on recipe R12 is completed in the head distribution unit 40, then an event I14 is transmitted to the MMC 30, thereby making it possible to transfer completion of the component mounting process based on recipe R12.

Moreover, in a case where an error is detected during a control operation in either the distribution units 40 or 60 when the component mounting process is executed, by transmitting error information to the MMC 30 similarly to the case of the component holding and pickup process, the error can be managed by correcting an already transmitted recipe, forming a new recipe, skipping the recipe or taking another measure according to a situation in the MMC 30.

As one example of a method for detecting presence or absence of such an error occurring in the component mounting process, it is possible to detect whether or not the component 1 has been mounted by detecting a vacuum pressure of the suction nozzle 3 with vacuum suction turned on by the suction nozzle 3 when the suction nozzle 3 is moved up after mounting of the component 1. Moreover, when an error is detected as described above, it is possible to disuse the component 1 or stop the component mounting apparatus 100 according to a situation of an occurrence of the error.

(The Component Holding and Pickup Process when Component Feed Unit is Component Feed Tray Type)

Next, as a modification example of the component mounting apparatus 100 according to the present first embodiment, a control operation of the component holding and pickup process when the component feed unit 6 is not provided with the component feed cassettes 7, but served as a component feed unit that has a plurality of component feed trays, will be described next.

Figure 14:
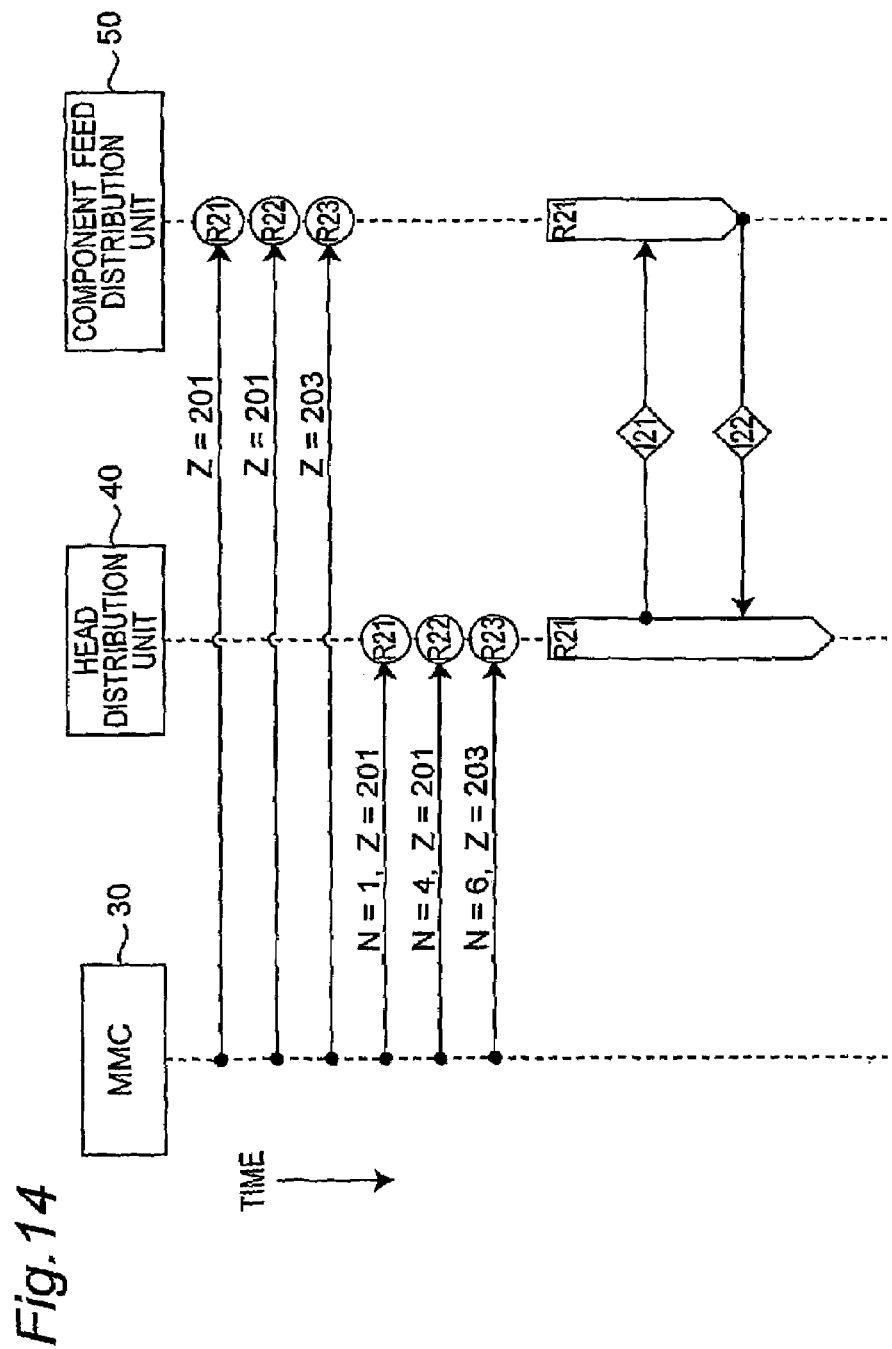
FIG. 14 is a schematic control flow chart in a case where a component feed tray is subjected to the component holding and pickup process of FIG. 5.

A plurality of electronic components are arranged while being allowed to be picked up on an upper surface of a component feed tray as described above. Moreover, a plurality of component feed trays as described above are stored in the component mounting apparatus, and a component 1 can be put into a state in which it can be picked up by suction nozzle 3 by pulling out a selected desired component feed tray and arranging the tray on, for example, machine table 10 in the component mounting apparatus 100. Components 1 to be thus fed by the component feed tray mainly include, for example, IC components, connector components of specific shapes and the like. Moreover, a case where the component 1 is held and picked up from the component feed tray as described above has a feature that a plurality of components 1 are not concurrently picked up by a plurality of suction nozzles 3, and a holding and pickup operation of each component 1 is sequentially performed for every suction nozzle 3. Therefore, a control operation in holding and picking up the components 1 from the component feed tray becomes more simplified than the control operation in holding and picking up the components 1 from the component feed cassettes 7. A schematic explanatory flow chart schematically showing information communications, i.e., a transfer state of recipes and events between MMC 30, head distribution unit 40 and component feed distribution unit 50 (denoted by the same reference numerals as in the case where the component feed cassettes 7 are provided) in executing a component holding and pickup process is shown in FIG. 14, and reference is made on the basis of this FIG. 14. In FIG. 14, it is assumed that the component feed unit is provided with, for example, three component feed trays 201 through 203 (note that 202 is not shown) as a plurality of component feed trays, and the component feed trays are indicated by tray number "Z=201".

As shown in FIG. 14, a plurality of recipes R21 through R23 to be executed in the head distribution unit 40 and the component feed distribution unit 50 are formed first in the MMC 30, and formed recipes R21 through R23 are subsequently transmitted from the MMC 30 to the distribution units 40 and 50.

Referring to a concrete example for explanation, as shown in FIG. 14, for example, in a case where the components 1 are each sucked and held by executing the component holding and pickup process of the components 1 three times for each of the suction nozzles provided for the head unit 4 (i.e., by executing the component holding and pickup process three times for each of the suction nozzles 3 with regard to the three suction nozzles 3) and thereafter the component mounting process is executed by the head unit 4, a recipe is formed for every component holding and pickup process, i.e., the three recipes R21, R22 and R23 are formed in the MMC 30.

Recipe R21 transmitted to the component feed distribution unit 50 is formed containing information of the tray number like, for example, "Z=201" so that the component feed tray from which the component 1 is to be picked up during the component holding and pickup process executed at a first time can be recognized by the component feed distribution unit 50. Likewise, recipe R22 and recipe R23 are formed containing information of the numbers of the trays from which the components 1 are to be picked up in a next component holding and pickup process like "Z=201" and "Z=203", respectively.

On the other hand, recipe R21 transmitted to the head distribution unit 40 is formed containing information of the nozzle number like, for example, "N=1" so that the suction nozzle 3 that should suck and hold the component 1 during the component holding and pickup process executed at the first time can be recognized by the head distribution unit 40. Likewise, recipe R22 and recipe R23 are formed containing information of "N=4" and "N=6", respectively. Moreover, recipes R21 through R23 transmitted to the head distribution unit 40 also contain information of the tray numbers in addition to the information of the nozzle numbers.

Moreover, with regard to a sequence of transmitting recipes from the MMC 30 to the head distribution unit 40 and the component feed distribution unit 50, priority may be given to either of them. However, considering the component mounting operation, it is preferable to first execute transmission to the component feed distribution unit 50 similarly to the case of the component holding and pickup process in the component feed cassette 7.

Subsequently, as shown in FIG. 14, execution of recipe R21 to be executed first out of received recipes R21 through R23 is started in the distribution units 40 and 50.

Concretely, in the component feed distribution unit 50, an operation of selecting, pulling out and arranging the component feed tray of the tray number Z=201 above the machine table 10 is executed on the basis of recipe R21.

On the other hand, in the head distribution unit 40, a descent operation of the suction nozzle 3 of the nozzle number N=1 is started on the basis of recipe R21. If the suction nozzle 3 is moved down to the descent standby height position H1, then an event I21 is transmitted from the head distribution unit 40 to the component feed distribution unit 50.

In the component feed distribution unit 50 that has received this event I21, an arrangement operation of the component feed tray is continued without interruption. If the arrangement operation is completed and the component 1 is put in a state in which it can be picked up, an event 122 is transmitted to the head distribution unit 40 in order to transfer this state.

In the head distribution unit 40 that has received event I22, the suction nozzle 3 is further moved down from the descent standby height position H1, and holding and pickup of the component 1 from the component feed tray is executed.

Although a subsequent operation is not shown in FIG. 14, operations based on recipes R22 and R23 are sequentially executed to proceed the component holding and pickup process similarly to the case of the component holding and pickup process in the component feed cassette 7 (FIGS. 5 and 6).

Although main control operations thus executed in the distributed control system 101 have been described as above, each of the control operations is merely one example, and the control operations of the distributed control system 101 should not be interpreted as limited only to these control operations.

For example, relationships between the MMC 30, the head distribution unit 40 and the X-Y robot distribution unit 60 in executing the component holding and pickup process can be roughly similarly applied to information communications of recipes and events and so on between the MMC 30, the head distribution unit 40 and the X-Y robot distribution unit 60 in executing the component mounting process. That is, in the component holding and pickup process, a head moving process for the component holding and pickup process is executed in the X-Y robot distribution unit 60, and the component holding and pickup process is executed by executing information communications of recipes and events and so on between the MMC 30, the head distribution unit 40 and the X-Y robot distribution unit 60 while correlating them with one another.

Moreover, the present first embodiment has been described on the basis of the distributed control system 101 provided for the component mounting apparatus 100 that has the head unit 4 intended for executing component mounting.

However, in place of the head unit 4 being provided, it is acceptable to provide, for example, an applicator head unit for supplying a bonding material of solder or the like to the board 2. This is because such an applicator head unit executes an operation of supplying the bonding material to a component mounting position of the component 1 on the board 2 while being moved in the X-direction and Y-direction by the X-Y robot 8, and therefore, the operation substantially becomes an operation similar to the component mounting process and is able to be applied to a case where such an operational process is executed.

Furthermore, it is acceptable to provide such a distribution unit for the board conveyance unit 9 of the component mounting apparatus 100 and adopt a control operation by the distributed control system. This is because, for example, a feeding conveyance operation and a discharging conveyance operation of the board 2 in the board conveyance unit 9 are correlated with holding or a hold release operation of the board 2 performed by the stage 5, and also related to a component mounting operation performed by the head unit 4.

Although not illustrated in the component mounting apparatus 100 shown in FIG. 1, it is acceptable to provide a distribution unit for the component imaging device and apply a control operation by the distributed control system. This is because, for example, imaging of the component 1, that is sucked and held by the suction nozzle 3, in the component imaging device is closely related to movement of the head unit 4 by the X-Y robot 8 and an elevation operation of the suction nozzle 3 in the head unit 4 and the like, and the component mounting process is executed while further correcting a suction and holding posture of the component 1 on the basis of a captured image.

The above description has been based on a case where the MMC 30 in the distributed control system 101 has the recipe forming section 33, and each recipe is formed in the recipe forming section 33 on the basis of mounting data of externally inputted NC data and the like. However, the distributed control system 101 of the present first embodiment is not limited only to the above case. Instead of the above case, it is acceptable to provide no recipe forming section 33 for the MMC 30, input each recipe preparatorily formed outside the component mounting apparatus 100 to the MMC 30, and transmit each recipe from the MMC 30 to each distribution unit. This is because a difference resides only in that a recipe formed in the MMC 30 or an externally formed recipe is transmitted and substantially similar control can be executed.

Furthermore, each recipe formed in the recipe forming section 33 of the MMC 30 is not required to be formed every time. For example, when a similar control operation is repetitively executed, it is acceptable to store and retain a once formed recipe in the main memory 34 and reuse the same by reading it as needed. This is because such reuse is labor saving in forming a new recipe, and a more efficient control operation can be executed for a similar control operation to be repetitively executed.

Although the above description has been based on the case where the distributed control system 101 is provided with the plurality of distribution units, the present invention is not limited only to this case. For example, the distributed control system may be provided with only one distribution unit. In concrete, the distributed control system 101 of FIG. 3 is provided with only the head distribution unit 40 as a distribution unit, and is provided with neither the component feed distribution unit 50 nor the X-Y robot distribution unit

60. In the above case, motion control of the component feed unit 6 and the motion control of the X-Y robot 8 are directly executed by the MMC 30.

Referring to one example of contents of a control operation for explanation, for example, the component feed unit 6 is provided with a component feed cassette that has a mechanism merely required to complete a component feed process before start of a descent operation of the suction nozzle 3, the MMC 30 transmits a recipe to the head distribution unit 40 after previously completing operation of a component feed process of the component feed cassette, and the head distribution unit 40 can complete a series of component pickup process of descent, suction and holding and ascent of the suction nozzle 3 on the basis of a received recipe.

The above description has been based on a case where mutually correlated control is executed by transferring events between the distribution units in the distributed control system 101. However, it is acceptable to transfer no event between the distribution units when mutual correlation during control is not so important instead of the above case. In such a case, distributed control is to be individually executed in each distribution unit on the basis of each recipe transmitted from the MMC 30.

The above description has been based on a case where the head distribution unit 40 is provided for the head unit 4, the component feed distribution unit 50 is provided for the component feed unit 6, and the X-Y robot distribution unit 60 is provided for the X-Y robot 8 in the distributed control system 101. However, installation locations of the distribution units are not limited to the above locations, and the installation locations can be freely determined so long as the aforementioned distributed control can be executed. That is, the installation locations of the distribution units are not limited only to objective hardware to be controlled.

Effects of the First Embodiment

According to the aforementioned first embodiment, the following various effects can be obtained.

First of all, instead of adopting a "centralized control system" that intensively controls operation of a plurality of constituent sections by one control unit as in the control system of the conventional component mounting apparatus, the constituent sections themselves are individually provided with control units called distributed control units. By enabling a motion control of the distribution units by making the distributed units dialog (i.e., communicate) with one another while correlating operations of them with one another, it is possible to confirm a fundamental operation, operational controllability and the like of these individual constituent sections at an early stage in an apparatus developmental process and efficiently perform confirmation of a control performance of the component mounting apparatus in its entirety.

Concretely, in the distributed control system 101 provided with the MMC 30 that forms recipes of an operational program to be executed in each distribution unit and transmits the recipes to the head distribution unit 40 that executes control of operation in the head unit 4 on the basis of a recipe, the component feed distribution unit 50 that executes control of the operation in the component feed unit 6 on the basis of the recipe, and the X-Y robot distribution unit 60 that executes control of operation in the X-Y robot 8 on the basis of the recipe, by transmitting a timing signal called an event from the distribution units 40, 50 and 60 to the other distribution unit 40, 50 or 60 on the basis of states of motion control based on the recipe without intervention of the MMC 30, a correlated motion control can be executed through mutual recognition of states of motion control in the distribution units.

Therefore, functions, control software and the like to be provided for the MMC 30 can be reduced, and functions, control software and the like conventionally borne by the MMC 30 can be distributionally provided for the distribution units 40, 50 and 60 in place of them. Therefore, if recipes and events, which can be pseudo-formable even without actual constituent sections, are prepared in an apparatus developmental stage, functions and control performances can be confirmed at an early stage in distribution units, and a developmental period can be remarkably shortened in comparison with the conventional centralized control system.

Moreover, by shortening a developmental period as described above, it becomes possible to provide an apparatus that answers various needs of users of the component mounting apparatus in a short time, thereby taking advantage of this shortened period. Moreover, it is possible to obtain a period for sufficiently providing controllability, and therefore provide a component mounting apparatus whose control accuracy is improved.

Moreover, by making the distribution units 40, 50 and 60 distributionally bear advanced complicated control required for a current component mounting apparatus without concentrating control processing on one portion, processing speed can be improved, and controllability can be made satisfactory.

Furthermore, a mutual correlation between control operations of the head unit 4, the component feed unit 6 and the X-Y robot 8 can be achieved by directly transmitting and receiving events between the distribution units by the communication control section 35 without intervention of the MMC 30, and a control response can therefore be made satisfactory.

Moreover, communications between the distribution units can be suppressed principally to mere transmission and reception of events, and each motion control is executed in each of the distribution units on the basis of a recipe. Therefore, wirings between the distribution units can be reduced, and an apparatus manufacturing cost can also be reduced in terms of hardware.

Moreover, with particular regard to control during component mounting, like mutual operational timing relationships between the component holding preparational operation and the component holding main operation in the head unit 4, the component feed preparational operation and the component feed main operation in the component feed unit 6, mutual operational timing relationships between the component mounting preparational operation and the component mounting main operation in the head unit 4, a time of arrival to a timing zone during a head moving process, and a time of arrival to the component mounting position in the X-Y robot 8, there is required closely correlated control between predetermined operations and processes and operations and processes in other constituent sections. This therefore implies existence of an advantage in that a control operation by the distributed control system 101 to correlate operations by transmitting events while executing control of operations and so forth on the basis of recipes can be more effectively applied to component mounting.

Second Embodiment

The present invention is not limited to the aforementioned embodiment and is able to be materialized in other various embodiments. For example, FIG. 15 shows a control block diagram showing a principal construction of a distributed control system 301 provided for a component mounting apparatus according to a second embodiment of the present invention.

Figure 15:
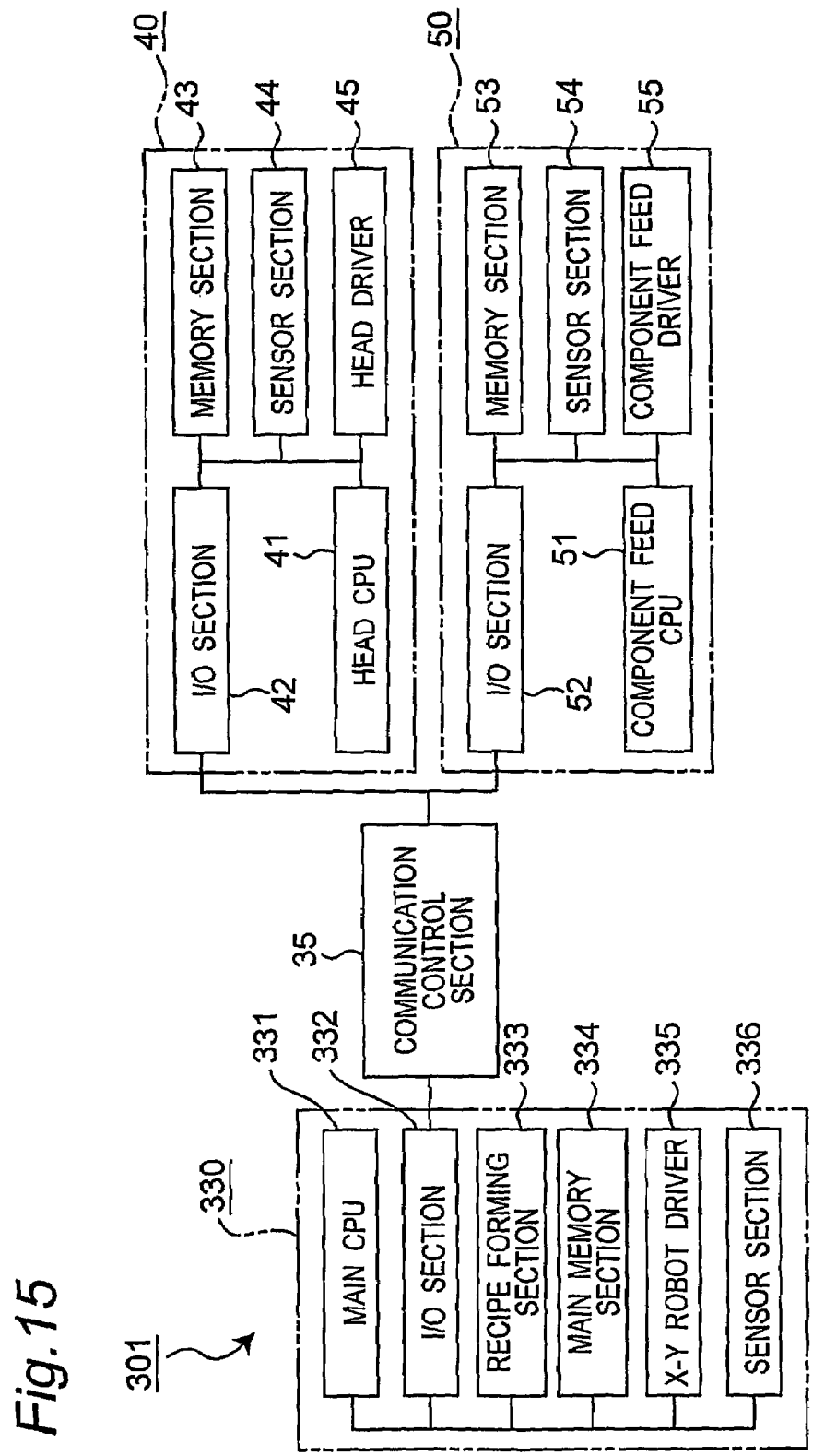
FIG. 15 is a control block diagram of a distributed control system provided for a component mounting apparatus according to a second embodiment of the present invention.

As shown in FIG. 15, the distributed control system 301 has a construction differing from the distributed control system 101 of the first embodiment in that the X-Y robot distribution unit 60 is not provided, although this control system is provided with an MMC 330 that is one example of a main control section, a head distribution unit 40 that is one example of a head unit control section, a component feed distribution unit 50 that is one example of a component feed unit control section, and a communication control section 35 that is an interface board for controlling informational communications between the MMC 330 and the distribution units 40 and 50 similarly to the distributed control system 101. Sections that have the same constructions as those of the distributed control system 101 are denoted by the same reference numerals in the distributed control system 301. Only sections of different constructions will be described below.

As shown in FIG. 15, in the distributed control system 301, the MMC 330 totally includes functions and constructions of the MMC 30 and the X-Y robot distribution unit 60 of the distributed control system 101. In concrete, as shown in FIG. 15, the MMC 330 further includes an X-Y robot driver 335 and a sensor section 336 that have functions and constructions similar to those of the X-Y robot driver 65 and the sensor section 64 in addition to a main CPU 331, an input/output section 332, a recipe forming section 333 and a main memory 334 that have functions and constructions similar to those of the main CPU 31, the input/output section 32, the recipe forming section 33 and the main memory 34. The main CPU 331 is able to control the X-Y robot driver 335 and the sensor section 336.

In the distributed control system 301 of the aforementioned construction, there can be provided a system intermediate the centralized control system and the distributed control system, in which motion control of the head unit 4 and the component feed unit 8 are executed by the distribution units 40 and 50 while motion control of the X-Y robot 8, that is required to execute an intermittent head moving process, is executed in the MMC 330 in both the component holding and pickup process and the component mounting process. Accordingly, there can be provided a component mounting apparatus, which is able to obtain effects of the first embodiment even with the distributed control system 301 that has the aforementioned construction, and obtain effects of shortening a developmental period and improving controllability.

Third Embodiment

Figure 16:
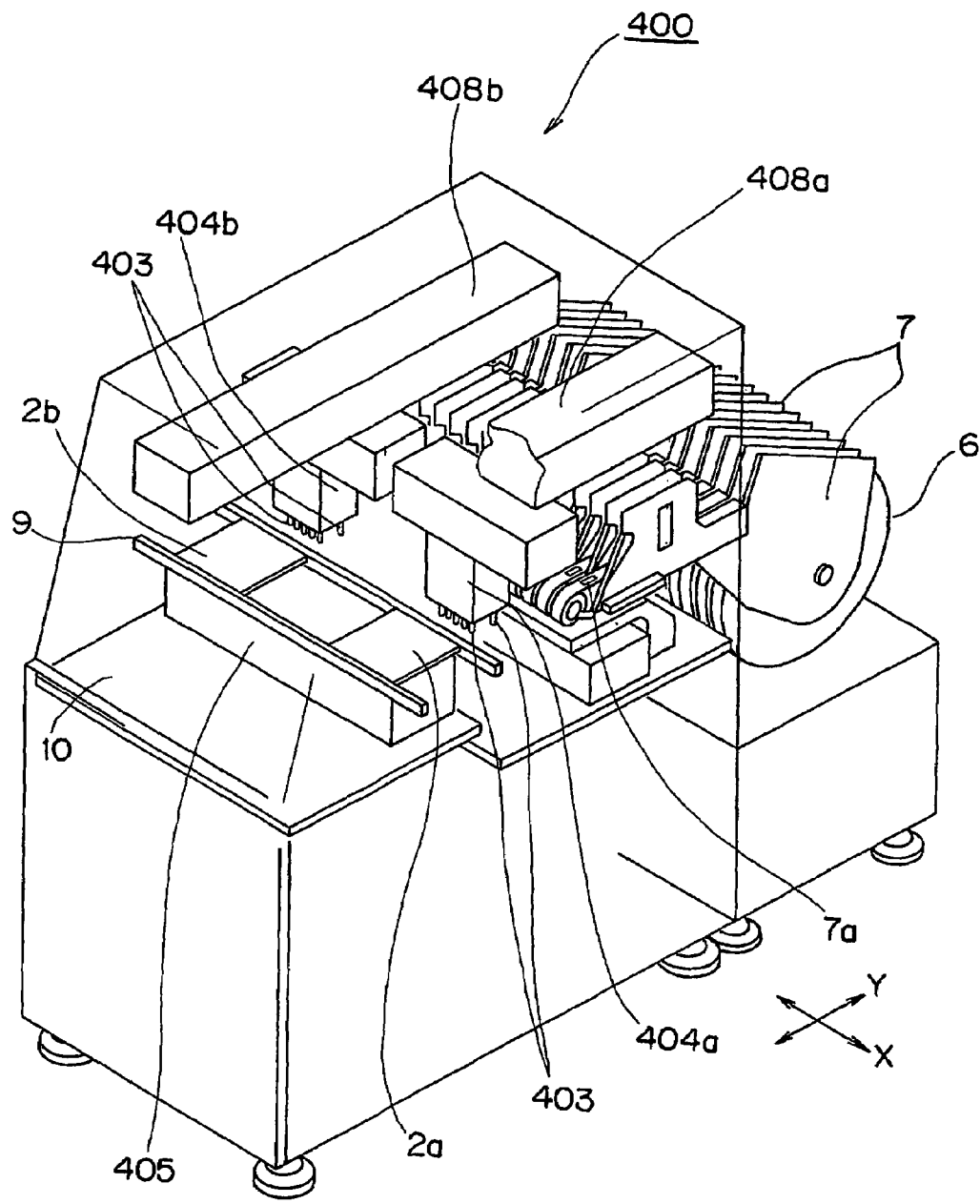
FIG. 16 is a schematic perspective view showing a schematic construction of a component mounting apparatus according to a third embodiment of the present invention.

Further, FIG. 16 shows a schematic perspective view showing a schematic construction of a component mounting apparatus 400 that is one example of a component mounting apparatus according to a third embodiment of the present invention.

As shown in FIG. 16, the component mounting apparatus 400 differs from the component mounting apparatus 100 of the first embodiment in that two head units and two X-Y robots are provided, and only different sections will be described below. In FIG. 16, sections that have the same constructions as those of the component mounting apparatus 100 are denoted by the same reference numerals.

As shown in FIG. 16, the component mounting apparatus 400 is provided with a component feed unit 6 that feeds a plurality of components 1 while allowing the components 1 to be picked up, and a stage 405 that is one example of a board holding section that releasably holds two boards 2a and 2b on which fed components 1 are mounted. The component mounting apparatus 400 is further provided with a first head unit 404a and a second head unit 404b, which are two head units that hold and pick up the components 1 fed from the component feed unit 6, and mount these components 1 onto respective boards 2a and 2b held by the stage 405, and a first X-Y robot 408a and a second X-Y robot 408b, which are two X-Y robots of one example of a head moving unit for moving the first head unit 404a and the second head unit 404b in the X-direction and Y-direction. Moreover, the first head unit 404a and the second head unit 404b are each provided with a plurality of suction nozzles 403 as one example of component holding members for releasably sucking and holding the components 1.

With the aforementioned construction possessed by the component mounting apparatus 400, it is possible to suck and hold and pick up component 1 from the component feed unit 6, and execute a mounting operation of the component 1 onto the board 2a held on the right-hand side of the stage 405 in FIG. 16, by executing operations of the first head unit 404a and the first X-Y robot 408a, and it is possible to suck and hold and pick up component 1 from the component feed unit 6 and execute a mounting operation of this component 1 onto the board 2b held on the left-hand side of the stage 405 in FIG. 16 by executing operations of the second head unit 404b and the second X-Y robot 408b. Therefore, component mounting can be more efficiently executed in the component mounting apparatus 400.

Figure 17:
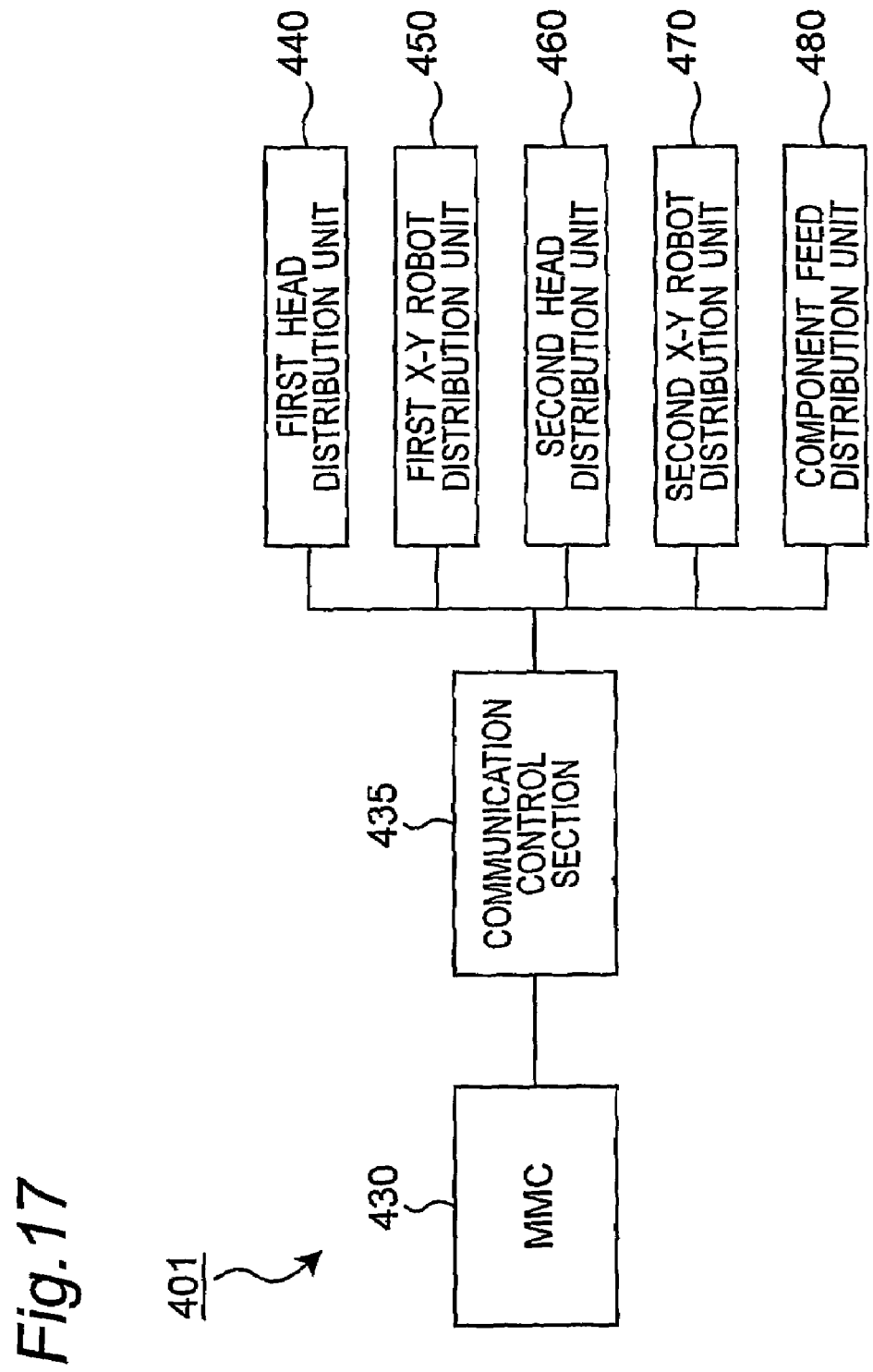
FIG. 17 is a control block diagram of a distributed control system provided for the component mounting apparatus of the third embodiment.
Figure 18:
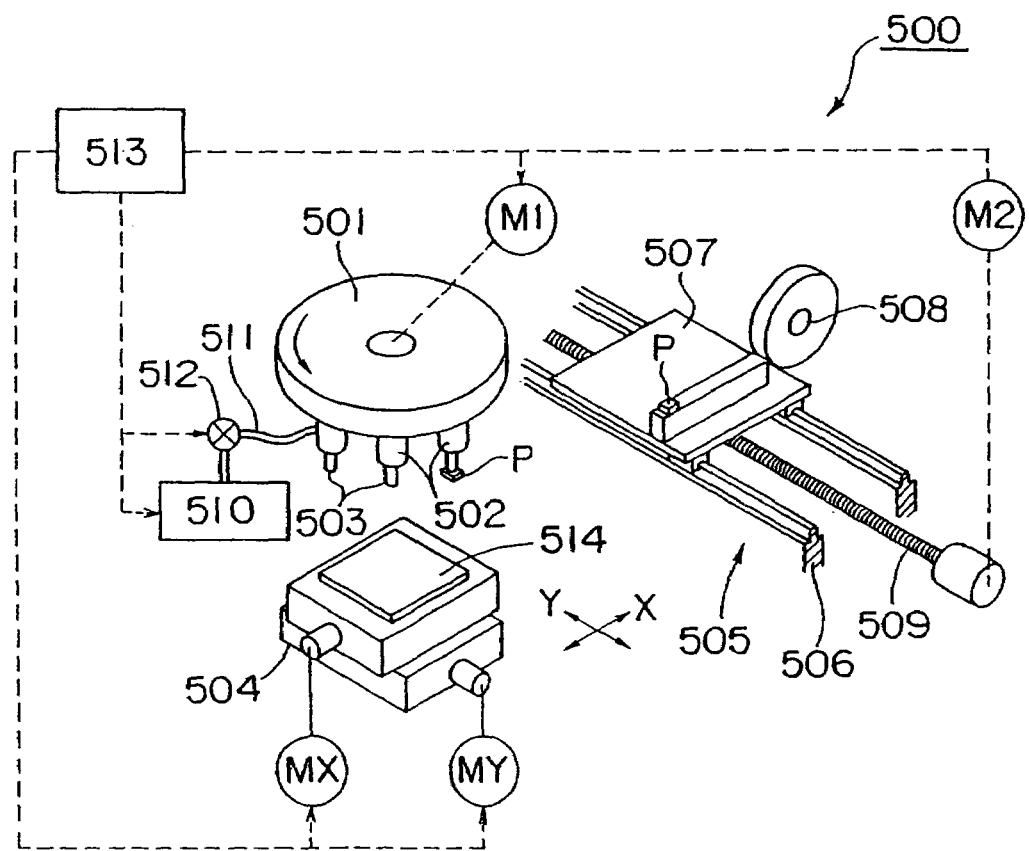
FIG. 18 is a schematic explanatory view showing a construction of control of a conventional component mounting apparatus.

Next, FIG. 17 shows a control block diagram showing a principal construction of a distributed control system 401 provided for the aforementioned component mounting apparatus 400.

As shown in FIG. 17, the distributed control system 401 is provided with an MMC 430 that is one example of a main control section, a first head distribution unit 440 that is one example of a head unit control section and executes motion control of the first head unit 404a, a first X-Y robot distribution unit 450 that is one example of a moving unit control section and executes motion control of the first X-Y robot 408a, a second head distribution unit 460 that is one example of a head unit control section and executes motion control of the second head unit 404b, a second X-Y robot distribution unit 470 that is one example of a moving unit control section and executes motion control of the second X-Y robot 408b, and a component feed distribution unit 480 that is one example of a component feed unit control section and executes motion control of the component feed unit 6. Moreover, the MMC 430 has a function and a construction similar to those of the MMC 30 of the first embodiment, and the distribution units have functions and constructions similar to those of the distribution units of the first embodiment. Therefore, recipes are formed in the MMC 430 and transmitted to the distribution units, and events are transmitted and received between the distribution units. The above informational communications are executed under control of a communication control section 435.

According to the third embodiment as described above, even if a number of objective constituent sections to be controlled is increased as in a case where the component mounting apparatus 400 is provided with the first head unit 404a and the second head unit 404b as well as the first X-Y robot 408a and the second X-Y robot 408b, an amount of load of control processing imposed on the constituent sections can be made roughly equivalent compared to the first embodiment by adopting the distributed control system 401. Therefore, this construction can cope with more complicated and advanced control, and efficient component mounting can be provided, thereby allowing effects similar to those of the first embodiment to be obtained.

By properly combining arbitrary embodiments of the aforementioned various embodiments, effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component mounting apparatus comprising:
a component feed unit for executing a component feed operation for feeding components in order to allow the components to be picked up;
a head unit, having component holding members for releasably holding the components, for executing a component holding and pickup operation for causing the components, fed by said component feed unit, to be held and picked up by at least one of said component holding members for mounting of the components onto a board;
a head unit control section for controlling the component holding and pickup operation to be executed by said head unit;
a component feed unit control section for controlling the component feed operation to be executed by said component feed unit; and
a main control section for transmitting to said head unit control section a recipe of an operational program for causing said head unit to execute the component holding and pickup operation, and for transmitting to said component feed unit control section a recipe of an operational program for causing said component feed unit to execute the component feed operation, with said head unit control section being operable to control said head unit to execute the component holding and pickup operation based on the recipe transmitted by said main control section to said head unit control section, and with said component feed unit control section being operable to control said component feed unit to execute the component feed operation based on the recipe transmitted by said main control section to said component feed unit control section,
wherein said head unit control section is operable to transmit a timing signal, based on execution of the component holding and pickup operation, to said component feed unit control section, and said component feed unit control section is operable to control said component feed unit to complete execution of the component feed operation based on the recipe transmitted by said main control section to said component feed unit control section and the timing signal transmitted by said head unit control section to said component feed unit control section.

2. The component mounting apparatus according to claim 1, further comprising:
a head moving unit for executing a head moving operation for moving said head unit in a direction roughly parallel to a surface of the board; and
a moving unit control section for controlling the head moving operation to be executed by said head moving unit,
wherein said main control section is also for transmitting to said moving unit control section a recipe for causing said head moving unit to execute the head moving operation, with said moving unit control section being operable to control said head moving unit to execute the head moving operation based on the recipe transmitted by said main control section to said moving unit control section.

3. The component mounting apparatus according to claim 2, wherein
said head unit control section is operable to transmit a timing signal, based on execution of the component holding and pickup operation, to said moving unit control section, and said moving unit control section is operable to control said head moving unit to complete execution of the head moving operation based on the recipe transmitted by said main control section to said moving unit control section and the timing signal transmitted by said head unit control section to said moving unit control section.

4. The component mounting apparatus according to claim 3, wherein
said moving unit control section is operable to transmit a timing signal, based on execution of the head moving operation, to said head unit control section, and said head unit control section is operable to control said head unit to complete execution of the component holding and pickup operation based on the recipe transmitted by said main control section to said head unit control section and the timing signal transmitted by said moving unit control section to said head unit control section.

5. The component mounting apparatus as defined in claim 3, wherein
said head unit control section is also operable to transmit timing signals that are formed based on positions of said component holding members along a direction roughly perpendicular to the surface of the board.

6. The component mounting apparatus according to claim 2, wherein
said head unit is also operable to execute a component mounting operation for mounting a component or components, held by said at least one of said component holding members, onto the board by causing the component or components to be released from said at least one of said component holding members, and
said main control section is also for transmitting to said head unit control section another recipe for causing said head unit to execute the component mounting operation, and is also for transmitting to said moving unit control section a further recipe for causing said head moving unit to execute a head moving operation associated with the component mounting operation,
with said head unit control section being operable to control said head unit to execute the component mounting operation based on the another recipe transmitted by said main control section to said head unit control section, and with said moving unit control section is operable to control said head moving unit to execute the head moving operation associated with the component mounting operation based on the further recipe transmitted by said main control section to said moving unit control section.

7. The component mounting apparatus according to claim 6, wherein
said head unit control section is also operable to transmit a timing signal, based on execution of the mounting operation, to said moving unit control section, and said moving unit control section is operable to control said head moving unit to complete execution of the head moving operation associated with the component mounting operation based on the further recipe transmitted by said main control section to said moving unit control section and the timing signal transmitted by said head unit control section to said moving unit control section.

8. The component mounting apparatus according to claim 6, wherein
said main control section is for transmitting to said head unit control section the further recipe for causing said head unit to execute the component mounting operation by transmitting to said head unit control section a recipe including information capable of recognizing said at least one of said component holding members to be used in execution of the component holding and pickup operation or in execution of the component mounting operation.

9. The component mounting apparatus according to claim 2, wherein
said main control section comprises
(i) a recipe forming section for forming each recipe, and
(ii) a recipe transmission section for transmitting each formed recipe.

10. The component mounting apparatus according to claim 9, wherein
at least one of said head unit control section, said component feed unit control section, and said moving unit control section, is operable to transmit to said main control section error information generated when operations are executed by a corresponding at least one of said head unit, said component feed unit, and said head moving unit, based on a corresponding recipe,
said recipe forming section is operable to correct a recipe relevant to the error information, from among already transmitted recipes, based on the error information transmitted to said main control section, and
said recipe transmission section is operable to transmit the corrected recipe so as to allow an already transmitted recipe to be replaced by the corrected recipe.

11. The component mounting apparatus according to claim 2, wherein
said main control section is for transmitting to said moving unit control section the recipe for causing said head moving unit to execute the head moving operation by transmitting to said moving unit control section a recipe including positional information corresponding to a movement position of said at least one of said component holding members, in a direction roughly along the surface of the board, at which the component holding and pickup operation is to be executed or a component mounting operation is to be executed.

12. The component mounting apparatus according to claim 2, wherein
said moving unit control section is provided for said head moving unit.

13. The component mounting apparatus according to claim 1, wherein
said main control section is for transmitting to said head unit control section the recipe for causing said head unit to execute the component holding and pickup operation by transmitting to said head unit control section a recipe including
(i) an operational program for executing a component holding preparational operation for causing said at least one of said component holding members to be moved down to a component holding standby height position along a direction roughly perpendicular to a surface of the board; and
(ii) an operational program for executing a component holding main operation for causing said at least one of said component holding members to be further moved down from the component holding standby height position and hold a component or components so as to allow the component or components to be picked up by said at least one of said component holding members, and
said head unit control section is operable to cause said component feed unit control section to recognize completion of execution of the component holding preparational operation by transmission of the timing signal from said head unit control section to said component feed unit control section.

14. The component mounting apparatus according to claim 1, wherein
said component feed unit comprises component pickup positions linearly arranged with a first constant pitch, and is to arrange the components so as to allow the components to be picked up by said component holding members,
said component holding members are arranged with a second constant pitch, that is an integral multiple of the first constant pitch, along a direction in which said component pickup positions are linearly arranged, and
said main control section is for transmitting to said component feed unit control section the recipe for causing said component feed unit to execute the component feed operation by transmitting to said component feed unit control section a recipe including positional information of at least one of said component pickup positions where the component feed operation is to be executed.

15. The component mounting apparatus according to claim 14, wherein
said main control section is for transmitting to said head unit control section the recipe for causing said head unit to execute the component holding and pickup operation by transmitting to said head unit control section a recipe including
(i) information capable of recognizing said at least one of said component holding members to be used in execution of the component holding and pickup operation, and
(ii) positional information of the at least one of the component pickup positions where the component feed operation is to be executed.

16. The component mounting apparatus according to claim 1, wherein
said head unit control section is provided for said head unit, and said component feed unit control section is provided for said component feed unit.

17. The component mounting apparatus according to claim 1, wherein said component feed unit control section is operable to transmit a timing signal, based on execution of the component feed operation, to said head unit control section, and said head unit control section is operable to control said head unit to complete execution of the component holding and pickup operation based on the recipe transmitted by said main control section to said head unit control section and the timing signal transmitted by said component feed unit control section to said head unit control section.

18. The component mounting apparatus according to claim 17, wherein said component feed unit comprises component pickup positions in which the components are to be arranged so as to allow the components to be picked up by said at least one of said component holding members, said main control section is for transmitting to said component feed unit control section the recipe for causing said component feed unit to execute the component feed operation by transmitting to said component feed unit a recipe including (i) an operational program for executing a component feed preparational operation for transporting the components in said component feed unit so that the components become positioned in the component pickup positions; and (ii) an operational program for executing a component feed main operation for putting the components, positioned in the component pickup positions, into a state in which the components can be picked up by said at least one of said component holding members, and said component feed unit control section is operable to control said component feed unit to execute the component feed preparational operation based on transmission of the recipe from said main control section to said component feed unit control section, operable to control said component feed unit to complete execution of the component feed main operation based on transmission of the recipe from said main control section to said component feed unit control section and transmission of the timing signal from said head unit control section to said component feed unit control section, and operable to cause said head unit control section to recognize completion of execution of the component feed main operation by transmission of the timing signal from said component feed unit control section to said head unit control section.

19. The component mounting apparatus according to claim 1, wherein said head unit control section is also operable to transmit timing signals that are formed based on positions of said component holding members along a direction roughly perpendicular to the surface of the board.

20. A component mounting method comprising:

receiving a recipe, of an operational program, for execution of a component holding and pickup operation to be performed by a head unit having component holding members for releasably holding components, and executing said component holding and pickup operation based on the received recipe, whereby at least one component fed by a component feed unit is held and picked up by at least one of said component holding members;

transmitting from said head unit to said component feed unit a timing signal based on execution of said component holding and pickup operation; and receiving a recipe, of an operational program, for execution of a component feed operation to be performed by said component feed unit, and completing said component feed operation based on this received recipe and said timing signal transmitted from said head unit to said component feed unit, whereby components are fed by said component feed unit so as to be allowed to be held and picked up by said component holding members for mounting onto a board.

21. The component mounting method according to claim 20, further comprising:

receiving in a head moving unit a recipe for execution of a head moving operation, and based on this received recipe, using said head moving unit to execute said head moving operation, whereby said head unit is moved roughly parallel to a surface of the board to a position above the board;

receiving in said head unit a recipe for execution of a component mounting operation, and based on this received recipe, using said head unit to execute said component mounting operation, whereby said at least one component that is held by said at least one of said component holding members is mounted onto the board; and transmitting from said head unit to said head moving unit a timing signal based on execution of said component mounting operation, wherein execution of said head moving operation is completed based on the recipe received in said head moving unit and said timing signal transmitted from said head unit to said head moving unit.

22. The component mounting method according to claim 21, wherein said recipe for execution of said component mounting operation, and said recipe for execution of said head moving operation, are formed on a main body side of a component mounting apparatus provided with said head unit and said component feed unit, such that receiving said recipe for execution of said component mounting operation comprises transmitting this recipe from the main body side of the component mounting apparatus to said head unit, and receiving said recipe for execution of said head moving operation comprises transmitting this recipe from the main body side of the component mounting apparatus to said head moving unit.

23. The component mounting method according to claim 21, further comprising:

transmitting to said head unit from said head moving unit, during execution of said head moving operation, a timing signal based on the execution of said head moving operation, wherein using said head unit to execute said component mounting operation comprises using said head unit to execute said component mounting operation based on said timing signal transmitted from said head moving unit to said head unit.

24. The component mounting method according to claim 20, wherein said recipe for execution of said component holding and pickup operation, and said recipe for execution of said component feed operation, are formed on a main body side of a component mounting apparatus provided with said head unit and said component feed unit, such that receiving said recipe for execution of said component holding and pickup operation comprises transmitting this recipe from the main body side of the component mounting apparatus to said head unit, and receiving said recipe for execution of said component feed operation comprises transmitting this recipe from the main body side of the component mounting apparatus to said component feed unit.

25. The component mounting method according to claim 20, further comprising:

transmitting to said head unit from said component feed unit, during execution of said component feed operation, a timing signal based on the execution of said component feed operation, wherein using said head unit to execute said component holding and pickup operation comprises using said head unit to execute said component holding and pickup operation based on said timing signal transmitted from said component feed unit to said head unit.

* * * * *